(12) United States Patent
Ryu et al.

(10) Patent No.: US 10,790,824 B1
(45) Date of Patent: Sep. 29, 2020

(54) SWITCHING OPERATION SENSING APPARATUS WITH TOUCH INPUT MEMBER IDENTIFICATION

(71) Applicant: Samsung Electro-Mechanics Co., Ltd., Suwon-si (KR)

(72) Inventors: Je Hyuk Ryu, Suwon-si (KR); Joo Yul Ko, Suwon-si (KR); Yong Woon Ji, Suwon-si (KR); Jong Woo Lee, Suwon-si (KR); Byung Joo Hong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/812,727

(22) Filed: Mar. 9, 2020

(30) Foreign Application Priority Data

Jul. 3, 2019 (KR) .................. 10-2019-0080120
Oct. 24, 2019 (KR) .................. 10-2019-0132912

(51) Int. Cl.
*H03K 17/955* (2006.01)
*H03K 17/96* (2006.01)
(Continued)

(52) U.S. Cl.
CPC ........... *H03K 17/962* (2013.01); *G06F 3/044* (2013.01); *G06F 3/046* (2013.01);
(Continued)

(58) Field of Classification Search
CPC ..... H03K 17/962; H03K 2217/960755; H03K 2217/96038; G06F 3/044; G06F 3/046; H03H 17/0671
See application file for complete search history.

(56) References Cited

U.S. PATENT DOCUMENTS 8,542,215 B2 * 9/2013 Hanauer ............... G06F 3/0416
345/174
8,723,833 B2 * 5/2014 Curtis ..................... G06F 3/044
178/18.06
(Continued)

FOREIGN PATENT DOCUMENTS

JP     2012-168747 A     9/2012
JP     2015-095865 A     5/2018
(Continued)

*Primary Examiner* — Kenneth B Wells
(74) *Attorney, Agent, or Firm* — NSIP Law

(57) ABSTRACT

A switching operation sensing apparatus includes an input operation unit, an oscillation circuit, a frequency digital converter, and a touch detection circuit. The input operation unit includes a first switching member integrally formed with a housing. The oscillation circuit is configured to generate an oscillation signal having a resonant frequency, varying based on a capacitive change or an inductive change, depending on a touch input member in contact with the first switching member during an input operation. The frequency digital converter is configured to convert the oscillation signal into a count value. The touch detection circuit is configured to detect capacitive sensing and inductive sensing based on a slope change of the count value received from the frequency digital converter, and output corresponding touch detection signals of different levels based on the detection.

23 Claims, 19 Drawing Sheets

(51) Int. Cl.
*G06F 3/041* (2006.01)
*G06F 3/044* (2006.01)
*G06F 3/046* (2006.01)
*H03H 17/06* (2006.01)

(52) U.S. Cl.
CPC .................. *H03H 17/0671* (2013.01); *H03K 2217/96038* (2013.01); *H03K 2217/960755* (2013.01)

(56) References Cited

U.S. PATENT DOCUMENTS

| | | | | |
|---|---|---|---|---|
| 8,729,913 | B2* | 5/2014 | Maharyta | G06F 3/044 |
| | | | | 324/658 |
| 8,933,907 | B2* | 1/2015 | Hanauer | G06F 3/044 |
| | | | | 345/174 |
| 9,310,952 | B2* | 4/2016 | Hanauer | G06F 3/0416 |
| 10,325,566 | B2* | 6/2019 | Kim | G06F 3/0416 |
| 10,444,892 | B2* | 10/2019 | Portmann | H03K 17/962 |
| 2015/0130649 | A1 | 5/2015 | Itakura et al. | |
| 2018/0093695 | A1 | 4/2018 | Hattori et al. | |
| 2018/0120364 | A1 | 5/2018 | Lee et al. | |

FOREIGN PATENT DOCUMENTS

| | | |
|---|---|---|
| KR | 10-2002-0077836 A | 10/2002 |
| KR | 10-2009-0120709 A | 11/2009 |
| KR | 10-2011-0087004 A | 8/2011 |
| KR | 10-2011-0087014 A | 8/2011 |
| KR | 10-2018-0046833 A | 5/2018 |

* cited by examiner

<WHEN TOUCHED BY HUMAN BODY PART>

<WHEN TOUCHED BY HUMAN BODY PART>

SWITCHING OPERATION SENSING APPARATUS WITH TOUCH INPUT MEMBER IDENTIFICATION

CROSS-REFERENCE TO RELATED APPLICATIONS

This application claims the benefit under 35 USC 119(a) of Korean Patent Application Nos. 10-2019-0080120 filed on Jul. 3, 2019, and 10-2019-0132912 filed on Oct. 24, 2019, in the Korean Intellectual Property Office, the entire disclosures of which are incorporated herein by reference for all purposes.

BACKGROUND

1. Field

This application relates to switching operation sensing apparatus with touch input member identification.

2. Description of Related Art

In general, it is desirable for a wearable device to be thin and to have a simple, clean design. To achieve this, existing mechanical switches in wearable devices have been replaced with non-mechanical switches implemented with dustproof and waterproof technologies to develop a seamless model.

Current technologies, such as a touch-on-metal (ToM) technology, in which a metal surface is touched, a capacitance sensing method using a touch panel, a microelectromechanical system (MEMS), a micro strain gauge, and other technologies have been developed. In addition, even a force touch function that can determine how hard a button has been pushed is under development.

In the case of existing mechanical switches, a relatively large size and an internal space are required to implement a switching function, which may have somewhat of an untidy design and a large amount of space may be required due to the protruding shape of the switch, and the structure of the switch may not be integrated into the external case, for example.

In addition, there is a risk of electric shock due to a direct contact with the electrically connected mechanical switch. Further, the structure of the mechanical switch makes it difficult to dustproof and waterproof.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a switching operation sensing apparatus includes an input operation unit, an oscillation circuit, a frequency digital converter, and a touch detection circuit. The input operation unit includes a first switching member integrally formed with a housing. The oscillation circuit is configured to generate an oscillation signal having a resonant frequency, varying based on a capacitive change or an inductive change, depending on a touch input member in contact with the first switching member during an input operation. The frequency digital converter is configured to convert the oscillation signal into a count value. The touch detection circuit is configured to detect capacitive sensing and inductive sensing based on a slope change of the count value received from the frequency digital converter, and output corresponding touch detection signals of different levels based on the detection.

The frequency digital converter may be further configured to generate the count value by counting a reference clock signal using the oscillation signal.

The first switching member and the housing may be formed of a same material.

The input operation unit may further include a second switching member integrated with the housing and disposed in a location different from a location of the first switching member, and the second switching member and the housing may be formed of the same material.

The oscillation circuit may include an inductance circuit and a capacitance circuit. The inductance circuit may include a first coil element disposed on an inner side of the first switching member. The capacitance circuit may include a capacitance element connected to the inductance circuit. The oscillation signal may have a first frequency characteristic when the first switching member is touched by a human body part and a second frequency characteristic when the first switching member is touched by a non-human body input member.

The oscillation circuit may include an inductance circuit and a capacitance circuit. The inductance circuit may include a first coil element disposed on an inner side of the first switching member, having a varying inductance when the first switching member is touched by a non-human body input member. The capacitance circuit, may include a capacitance element connected to the inductance circuit, having a varying capacitance when the first switching member is touched by a human body part.

The first coil element, mounted on a substrate, may be attached to an inner side surface of the first switching member.

The frequency digital converter may be further configured to generate a divided reference clock signal by dividing a reference frequency signal using a reference frequency division ratio, and output the count value generated by counting the divided reference clock signal using the oscillation signal.

The frequency digital converter may be further configured to generate a reference clock signal divided by dividing a reference frequency signal using a reference frequency division ratio, divide an oscillation signal from the oscillation circuit using a sensing frequency division ratio, and output the count value generated by counting the divided reference clock signal using the divided oscillation signal.

The frequency digital converter may include a frequency down-converter, a periodic timer, and a cascaded integrator-comb (CIC) filter circuit. The frequency down-converter may be configured to receive a reference frequency signal as a reference clock signal, and generate a divided reference clock by dividing the reference clock signal using a reference frequency division ratio to down-convert a frequency of the reference frequency signal. The periodic timer may be configured to receive the oscillation signal as a sample clock signal, and output a frequency count value generated by counting one-period time of the divided reference clock signal, received from the frequency down-converter, using the sample clock signal. The cascaded integrator-comb (CIC) filter circuit may be configured to output the count value generated by performing cumulative amplification on the period count value received from the periodic timer.

The CIC filter circuit may include a decimator CIC filter configured to output the count value generated by performing cumulative amplification on the period count value received from the periodic timer, perform cumulative amplification on the period count value from the period timer using a predetermined integral stage order, a predetermined decimator factor, and a predetermined comb differential delay order, and provide the cumulatively amplified period count value.

The touch detection circuit may differentiate the count value, received from the frequency digital converter, to generate the difference value and compares the difference value with each of a predetermined falling threshold value and a predetermined rising threshold value to output the touch detection signal having one of the different levels for identifying capacitive sensing and inductive sensing based on a comparison result.

The touch detection circuit may include a delay circuit, a subtraction circuit, and a slope detection circuit. The delay circuit may be configured to delay the count value, received from the frequency digital converter, by a time determined based on a delay control signal to output a delay count value. The subtraction circuit may be configured to subtract the count value from the delay count value to generate and output a difference value. The slope detection circuit may be configured to compare the difference value, received from the subtraction circuit, with each of a predetermined falling threshold value and a predetermined rising threshold value to output the touch detection signal having a first level or a second level for identifying capacitive sensing and inductive sensing based on a comparison result.

The slope detection circuit may include a slope detector, a falling slope detector, a rising slope detector, and a detection signal generator. The slope detector may be configured to determine whether the difference value decreases or increases, and output an enable signal in an active state when the difference value decreases and an enable signal in an inactive state when the difference value increases. The falling slope detector may be configured to generate a falling detection signal when the enable signal enters the active state and the difference value is less than or equal to a falling threshold value for a predetermined time. The rising slope detector may be configured to generate a rising detection signal when the enable signal enters the active state and the difference value is greater than or equal to a rising threshold value for the predetermined time. The detection signal generator may be configured to generate the touch detection signal having a first level or a second level based on the falling detection signal and the rising detection signal.

The detection signal generator may generate a touch detection signal, having a first level in response to a touch by a human body part, based on the falling detection signal and the rising detection signal, when the difference value increases after falling.

The detection signal generator may generate a touch detection signal, having a second level in response to inductive sensing, based on the falling detecting signal and the rising detection signal, when the difference value decreases after rising.

The apparatus may be any of Bluetooth headset, Bluetooth earphone, smart glasses, a VR headset, an AR headset, smart key button of a vehicle, laptop, computer, a head-mounted display (HMD), and a stylus touch pen.

In another general aspect, an apparatus includes a housing, an input operation unit, an oscillation circuit, and a touch detection circuit. The input operation unit includes a first switching member integrally formed with the housing. The oscillation circuit is configured to generate an oscillation signal based on a contact of touch input members on the first switching member. The touch detection circuit is configured to determine one of a capacitive sensing and an inductive sensing based on a change of slope of count values of the oscillation signal, and output a detection signal based on the determined sensing.

The oscillation circuit may be further configured to generate the oscillation signal having resonant frequencies corresponding to the touch input members in contact with the first switching member during an input operation.

A frequency digital converter, connected to the oscillator circuit, may be configured to convert the oscillation signal into the count values.

The input operation unit may further include a second switching member integrally formed with the housing and disposed in a location different from a location of the first switching member.

The contact of the touch input members may be determined to be the capacitive sensing when the contact is a human body touch, and the inductive sensing when the contact is a non-human input member.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
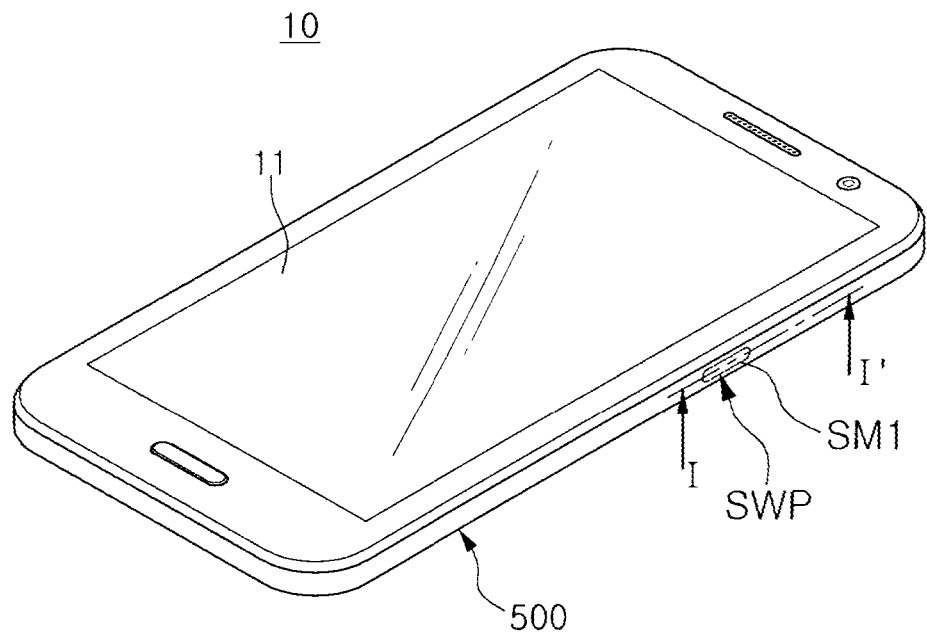
FIGS. 1A and 1B are diagrams of examples of mobile devices according to this application.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
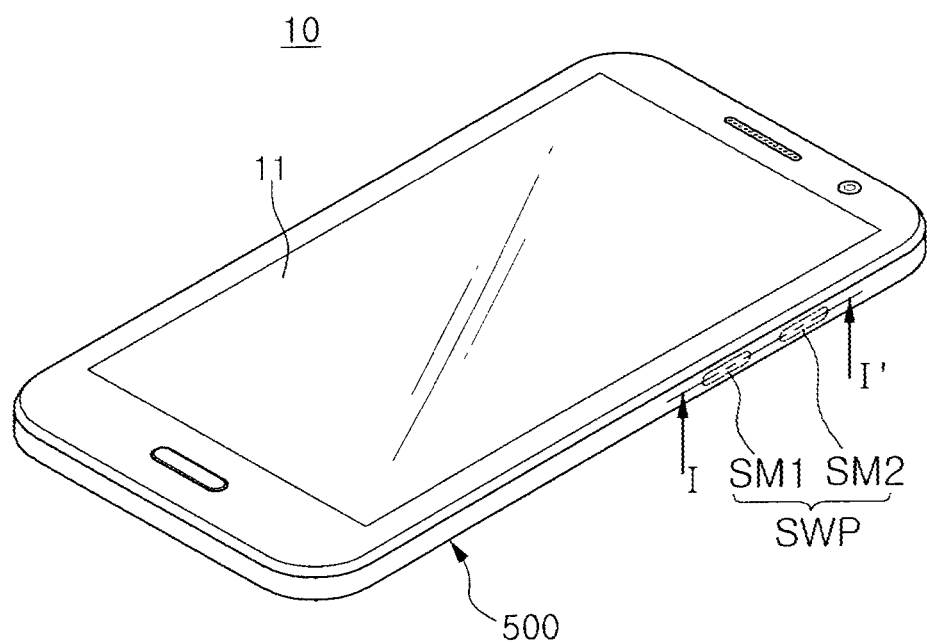

FIGS. 1A and 1B are appearance diagrams of examples of mobile devices according to this application.

In FIG. 1A, a mobile device 10 includes a touchscreen 11, a housing 500, and an input operation unit SWP. The input operation unit SWP may include a first switching member SM1 replacing a mechanical button switch.

In FIG. 1B, a mobile device 10 includes a touchscreen 11, a housing 500, and a touch input unit TSW. The touch input unit TSW may include first and second switching members SM1 and SM2 replacing mechanical button switches. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In FIG. 1B, the input operation unit SWP is illustrated as including the first and second switching members SM1 and SM2. However, this is a merely an example for ease of description, and the input operation unit SWP is not limited to the two switching members SM1 and SM2, and it will be appreciated that the number of touch members may be extended in the same manner as the first and second touch members.

As an example, in FIGS. 1A and 1B, the mobile device 10 may be a portable device such as a smartphone or a wearable device such as a smartwatch, but is not limited to any specific device. The mobile device 10 may be a portable or wearable electric device, or any electric device having a switch for operation control.

The housing 500 may be an external case for an electric device. For example, when the switching operation sensing apparatus is applied to a mobile device, the housing 500 may be a cover disposed on a side (a side surface) of the mobile device 10. As an example, the housing 500 may be integrated with a cover disposed on a back surface of the mobile device 10, or may be separate from the cover disposed on the back surface of the mobile device 10.

As described above, the housing 500 may be an external case of the electric device, but is not limited to any particular position, shape, or structure.

In FIG. 1B, each of the first and second switching members SM1 and SM2 may be disposed inside the housing 500 of the mobile device 10, but the disposition thereof is not limited thereto.

The first and second switching members SM1 and SM2 may be disposed on a cover of the mobile device 10. In this case, the cover may be a cover excluding a touchscreen, for example, a side cover, a back cover, or a cover that may be disposed on a portion of a front surface. For ease of description, a housing disposed on a side cover of a mobile device will be described as an example, but the housing is not limited thereto.

Figure 2:
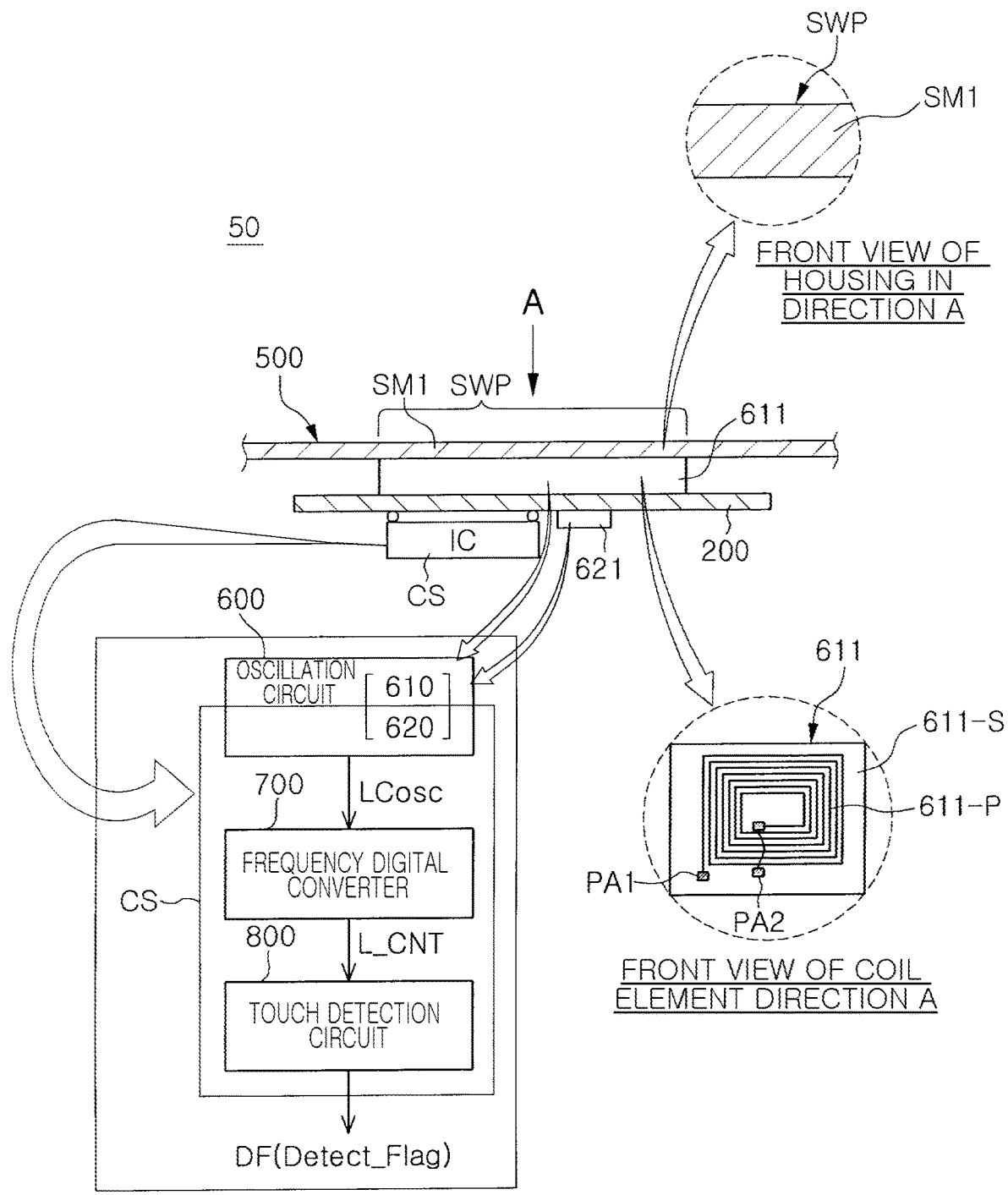
FIG. 2 is a cross-sectional view, taken along line I-I' in FIG. 1A, illustrating an example of a structure of a touch input sensing apparatus in FIG. 1A.

FIG. 2 is a cross-sectional view, taken along line I-I' in FIG. 1A, illustrating an example of a structure of a touch input sensing apparatus in FIG. 1A.

In FIG. 2, a switching operation sensing apparatus includes an input operation unit SWP, an oscillation circuit 600, a frequency digital converter 700, and a touch detection circuit 800.

The input operation unit SWP may include at least one first switching member SM1 integrated with a housing 500 of an electric device. As an example, the first switching member SM1 may include the same material as the housing 500.

The oscillation circuit 600 may generate an oscillation signal LCosc having an oscillation frequency that varies based on a capacitive change or an interactive change that depends on a touch input member during an input operation through the first switching member SM1. For example, the oscillation circuit 600 includes an inductance circuit 610 and a capacitance circuit 620. In the examples described in this application, a touch input member (or an object of input operation) may include a human body part such as a human hand and a non-human body input member such as plastic. In the examples described in this application, the input operation may be a concept including a touch input or a force input.

The frequency digital converter 700 may convert an oscillation signal from the oscillation circuit 600 into a count value. For example, the frequency digital converter 700 may convert the oscillation signal LCosc into the count value L_CNT in a frequency counting manner.

The touch detection circuit 800 may be configured to identify and detect capacitive sensing by a human body part and inductive sensing by a non-human body input member based on the count value L_CNT, input from the frequency digital converter 700, and may output touch detection signals (DF) Detect_Flag having different levels to each other based on the detection.

A first example of the input operation unit SWP will be described with reference to a front view of a housing in a direction A in FIG. 2.

As an example, the input operation unit SWP may include a first switching member SM1, and the first switching member SM1 may be integrated with the housing 50. Accordingly, the first switching member SM1 may be formed of the same material as the housing 500.

As an example, when the housing 500 includes a conductor such as a metal, the first switching member SM1 may also include a conductor. On the other hand, when the housing 500 includes an insulator such as plastic, the first switching member SM1 may also include an insulator.

With respect to a front view of a first coil element in direction A in FIG. 2, the inductance circuit 610 may be disposed on an inner side of the first switching member SM1 and may have a first coil element 611 having inductance Lind.

Figure 7:
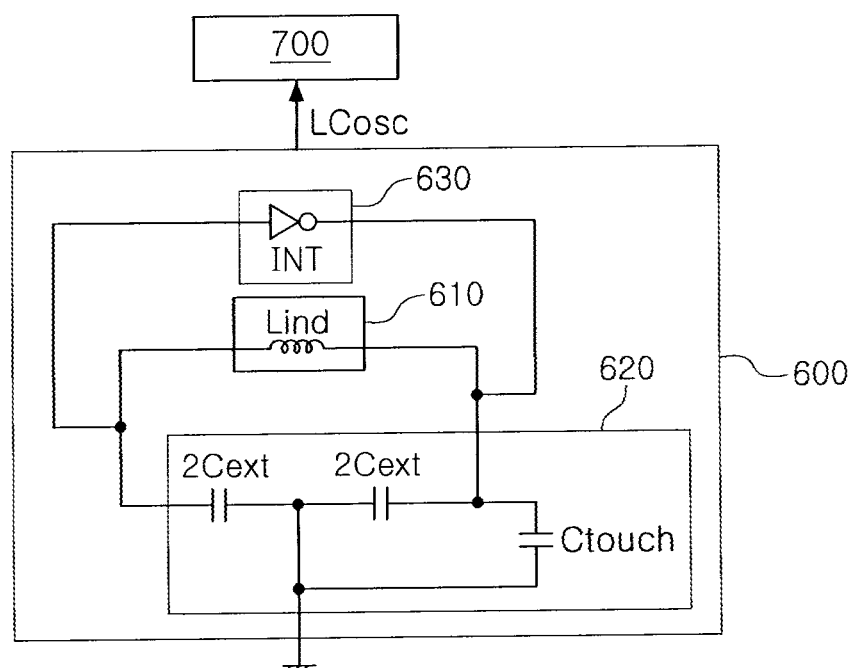
FIG. 7 is an example of a circuit diagram of an oscillation circuit when touched by a human body part.
Figure 8:
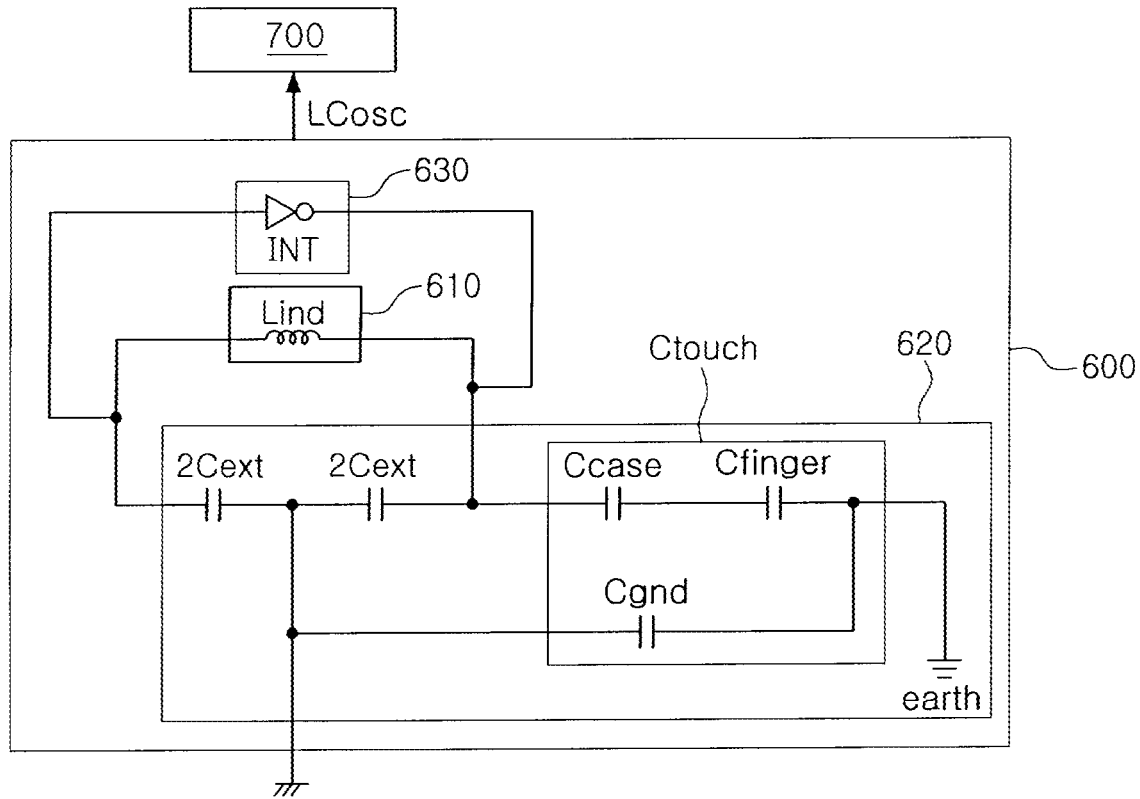
FIG. 8 is a detailed circuit diagram of the oscillation circuit in FIG. 7.

The capacitance circuit 620 may include a capacitance element 621, connected to the inductance circuit 610, having capacitance Cext. For example, the capacitance of the capacitance circuit 620 may include a touch capacitance Ctouch generated when the input operation unit TSW is touched, and the touch capacitance Ctouch (see FIG. 7) may be generated, as illustrated in FIGS. 7 and 8, to increase the overall capacitance of the oscillation circuit 600.

As an example, the first coil element 611 may include a first coil pattern 611-P having a spiral shape connected between a first pad PA1 and a second pad PA2 disposed on a PCB substrate 611-S.

In FIG. 2, the first coil element 611 may be disposed on one surface (for example, an upper surface) of the substrate 200, and a circuit member CS and a capacitance element 621, such as a multilayer ceramic capacitor (MLCC), or the like, may be disposed on another surface (for example, a lower surface) of the substrate 200.

As an example, the circuit member CS may be an integrated circuit (IC) including a portion of the oscillation circuit 600, the frequency digital converter 700, and the touch detection circuit 800.

The substrate 200 may be a printed circuit board (PCB) or a flexible printed circuit board (FPCB), but is not limited thereto. The substrate 200 may be a board on which a circuit pattern is formed, (for example, one of various circuit boards such as a PCB) or a panel (for example, a panel for a panel level package (PLP)).

The structure of the switching operation sensing apparatus illustrated in FIG. 2 is just an example, and is not limited thereto.

A non-limiting example of the first switching member SM1 has been described in FIG. 2, but the description of the first switching member SM1 may also be applicable to the second switching member SM2 (see FIG. 1B). For example, when the first switching member SM1 and the second switching member SM2 are included, a single circuit member CS may process different resonance signals, respectively corresponding to the first switching member SM1 and the second switching member SM2.

When describing the drawings of this application, repeated descriptions may be omitted for components having the same reference numeral and the same function, and only differences will be described.

Examples of a switching operation sensing apparatus described below may include a plurality of touch members. In an example, the plurality of touch members may be arranged in a line. Alternatively, the plurality of touch members may be arranged horizontally and vertically, in a matrix arrangement.

The examples of the switching operation sensing apparatus 50 illustrated in FIGS. 1A and 1B may include one or more switching members. However, the one or more switching members illustrated in FIGS. 1A and 1B are just non-limiting examples for ease of description, and touch members of the switching operation sensing apparatus are not limited thereto.

Accordingly, it will be appreciated that the switching operation sensing apparatus may include one or more touch members.

In the examples described in this application, the switching member may be integrated or integrally formed into the housing 500. The term "integrated" refers to the fact that irrespective of whether the material of the touch member and the material of the housing 500 are the same or different from each other, the touch member and the housing 500 are manufactured as a single body so that they cannot be readily separated from each other after manufacturing thereof and have a unitary structure, not an instrumentally or mechanically separated structure, in which there is no discernable gap between the touch member and the housing 500.

As an example, the first coil element 611 may be a PCB coil element formed as a printed circuit board (PCB) pattern, but is not limited thereto.

As an example, the first coil element 611 may be a PCB coil element implemented on a double-sided PCB or a multilayer PCB, but is not limited thereto.

As an example, the first coil element 611 may be formed in various shapes such as a circle, a triangle, a rectangle, and the like, and the shape of the first coil element 61 is not limited thereto.

In terms of components having the same reference numeral and the same function in embodiments of respective drawings, unnecessary overlapping descriptions thereof may be omitted, while differences between embodiments of respective drawings may be described.

Figure 3:
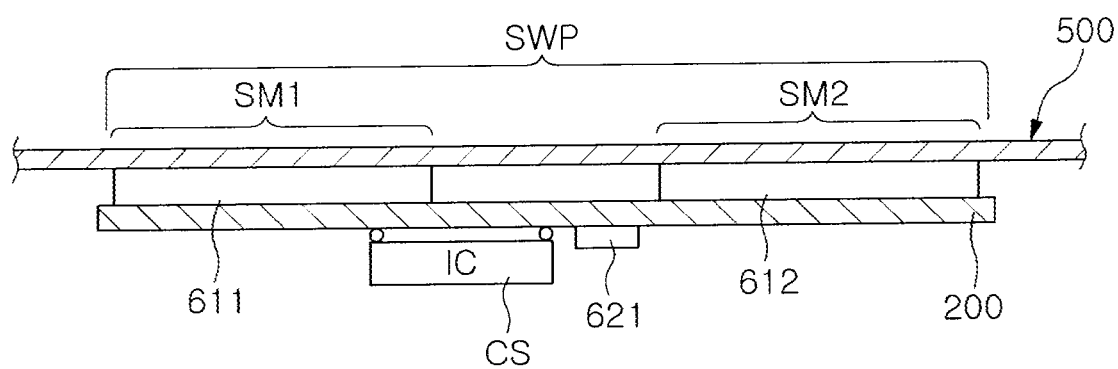
FIG. 3 is a cross-sectional view, taken along line I-I' in FIG. 1B, illustrating an example of a structure of a touch input sensing apparatus in FIG. 1B.

FIG. 3 is a cross-sectional view, taken along line II-II' in FIG. 1B, illustrating another example of a structure of a switching operation sensing apparatus in FIG. 1B.

In FIG. 3, a switching operation sensing apparatus includes an input operation unit SWP including a first switching member SM1 and a second switching member SM2.

Each of the first and second switching members SM1 and SM2 may be integrated, or integrally formed, with a housing 500 of a same material.

The inductance circuit 610 (see FIG. 2) of the oscillation circuit 600 (see FIG. 2) may include a first coil element 611 and a second coil element 612. The oscillation circuit 600 (see FIG. 2) may include a capacitance element 621. The first coil element 611, the second coil element 612, a capacitance element 621, and a circuit member CS may be mounted on a substrate 200.

The first coil element 611 may be disposed on an inner side of the first switching member SM1. The second coil element 612 may be disposed on an inner side of the second switching member SM2.

A switching operation sensing apparatus of this application may include a plurality of switching members. In this example, to generate different oscillation signals, based on a touch of each of the plurality of switching members, the switching operation sensing apparatus may include a plurality of coil elements, respectively corresponding to the plurality of switching members.

As an example, the first switching member SM1 and the second switching member SM2 may be formed of the same material as the housing 500. When the housing 500 includes a conductor such as a metal, the first switching member SM1 and the second switching member SM2 may also include a conductor. When the housing 500 includes an insulator such as plastic, the first switching member SM1 and the second switching member SM2 may also include an insulator.

In addition, a first coil element 611 and a second coil element 612 may be disposed on one side surface (for example, an upper surface) of the substrate 200. A circuit member CS and a capacitance element 621, such as an MLCC, or other types of capacitor, may be disposed on the other side surface (for example, a lower surface) of the substrate 200, in a non-limiting example. Such a disposition structure is merely an example, and is not limited thereto.

The first and second coil elements 611 and 612 are spaced apart from each other on one surface of the substrate 200, and are connected to a circuit pattern formed on the substrate 200. For example, each of the first and second coil elements 611A and 612A may be an individual coil element, such as a solenoid coil, a winding-type inductor, a chip inductor, or other types of individual coil element. However, each of the first and second coil elements 611 and 612 is not limited thereto, and may be any element having an inductance.

As an example, when the first and second switching members SM1 and SM2 constitute a conductive metal with high resistance (for example, 100 KΩ or higher), the interference between the first and second switching members SM1 and SM2 may be reduced, and thus the first and second switching members SM1 and SM2 may be actually applied to an electric device.

In the examples described in this application, the term "operation" refers to a touch, a force, or both the touch and the force input through the input operation unit.

Figure 4:
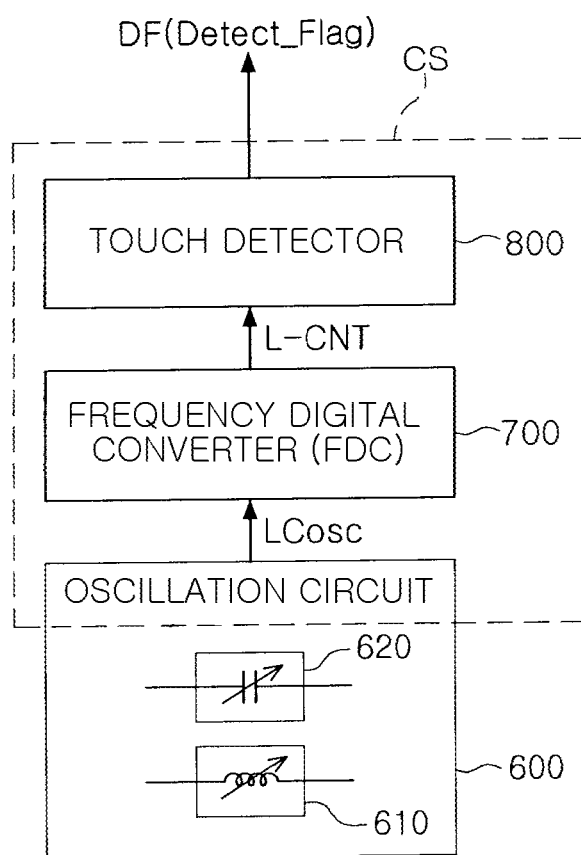
FIG. 4 is a block diagram of an example of an oscillation circuit and a circuit member of a switching operation sensing apparatus according to this application.

FIG. 4 is a block diagram of an example of an oscillation circuit and a circuit member of a switching operation sensing apparatus according to this application.

In FIG. 4, the switching operation sensing apparatus, according to this application, may include an oscillation circuit 600, a frequency digital converter 700, and a touch detection circuit 800. As described above, the oscillation circuit 600 may include an inductance circuit 610 and a capacitance circuit 620.

In an example of this application, the oscillation circuit 600 may be, for example, an LC oscillation circuit, but is not limited thereto. The oscillation circuit may be configured to generate an oscillation signal using a capacitance variable, depending on a touch of a human body part, or an inductance variable, depending on a touch of a non-human body input member.

The circuit member CS may include a portion of the oscillation circuit 600, the frequency digital converter 700, and the touch detection circuit 800. In this example, a portion of the oscillation circuit 600 may be an amplifier circuit 630. As an example, the amplifier circuit 630 may include an inverter or an amplifier element, and is not limited thereto, as long as it can maintain a resonance signal as an oscillation signal.

The circuit member CS may include a capacitance element. When the capacitance element is not included in the circuit member CS, the switching operation sensing apparatus may include a capacitance element 621, such as an MLCC disposed independently of the circuit member CS. In each example of this application, the circuit member CS may or may not be an integrated circuit (IC).

The digital frequency converter 700 may divide a reference frequency signal fref (see FIG. 11) by a reference frequency division ratio N to generate a divided reference clock signal DOSC_ref (see FIG. 11), and may count the divided reference clock signal DOSC_ref (see FIG. 11) using the oscillation signal to output a count value L_CNT.

Figure 13:
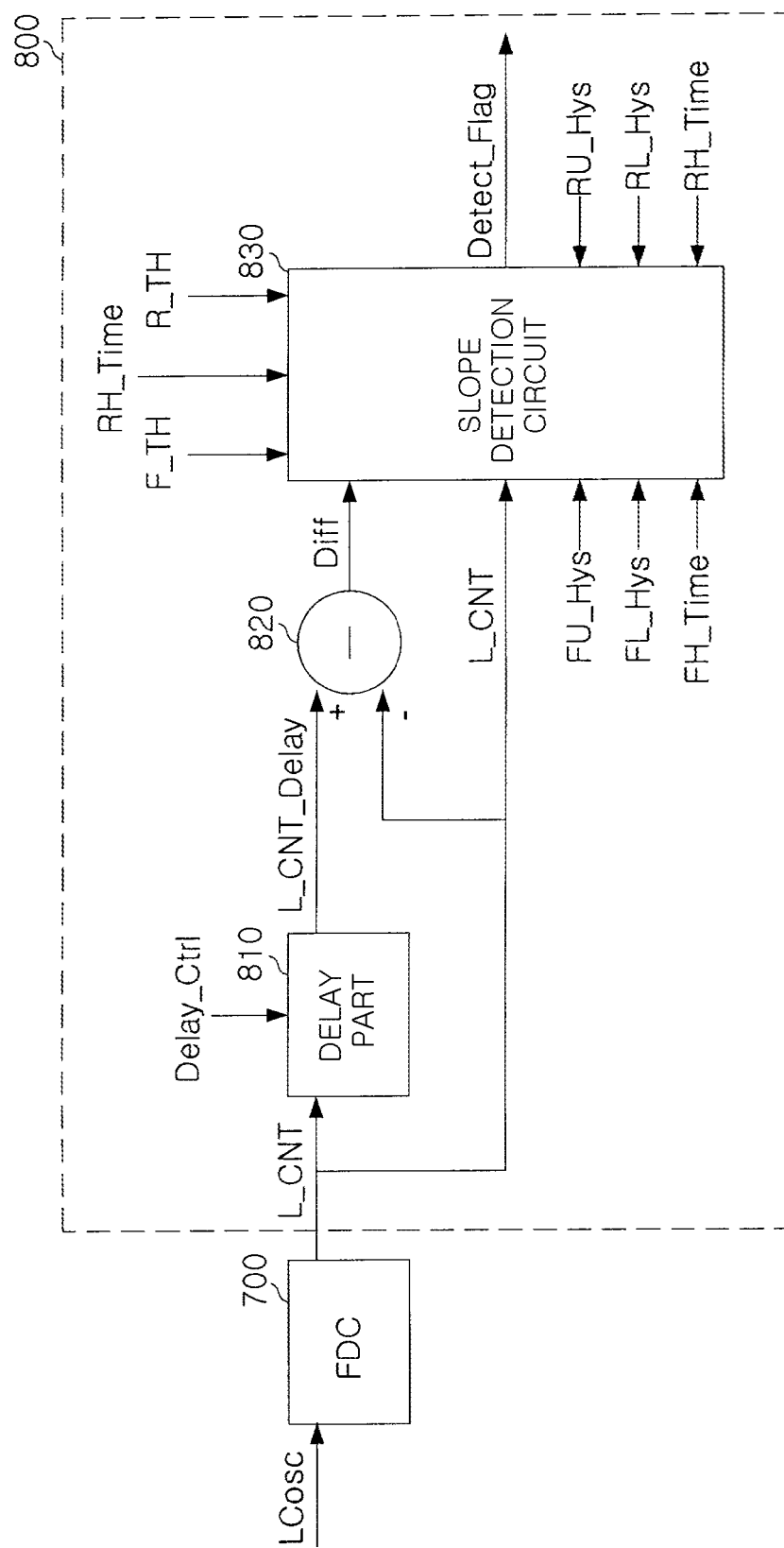
FIG. 13 is a block diagram illustrating an example of a touch detection circuit.

The touch detection circuit 800 may differentiate the count value L_CNT, received from the frequency digital converter 700, to generate a difference value Diff (see FIG. 13). The touch detection circuit 800 may compare the difference value Diff (see FIG. 13) with predetermined threshold values F_THL and R_TH (see FIG. 13) to output a touch detection signal DF Detect_Flag having a level for identifying a human touch or a non-human touch, based on a comparison result.

In the examples described in this application, the difference value Diff may correspond to a slope change value of a resonant frequency, a slope change value of a count value, or a differential value.

In the examples described in this application, the count value L_CNT is a digital value generated by a count processing operation using digital signal processing rather than analog signal processing. Accordingly, the count value L_CNT may not be generated by signal amplification performed by a simple analog amplifier, but may be generated according to a count processing operation performed by the frequency digital converter 700 of this application. Such a count processing operation requires a reference clock signal (for example, a reference frequency signal) and a sample clock signal (for example, an oscillation signal), which will be described later.

In FIGS. 2 and 4, for example, the oscillation circuit 600 may include an inductance circuit 610 and a capacitance circuit 620, as described above.

The inductance circuit 610 may include a first coil element 611 disposed inside the first switching member SM1, and the capacitance circuit 620 may include a capacitance element 621 connected to the inductance circuit 610.

As an example, the oscillation circuit 600 may generate an oscillation signal LCosc having a first frequency characteristic when the first switching member SM1 is touched by a human body part. The oscillation circuit 600 may generate an oscillation signal LCosc having a second frequency characteristic when the first switching member SM1 is touched by a non-human body input member.

As an example, the inductance circuit 610 may include an inductance varying when the first switching member SM1 is touched by a non-human body input member, and the capacitance circuit 620 may include a capacitance varying when touched by the human body part.

As an example, the first coil element 611 may be mounted on the substrate 200 and may be attached to an internal side surface of the first switching member SM1.

Figure 5:
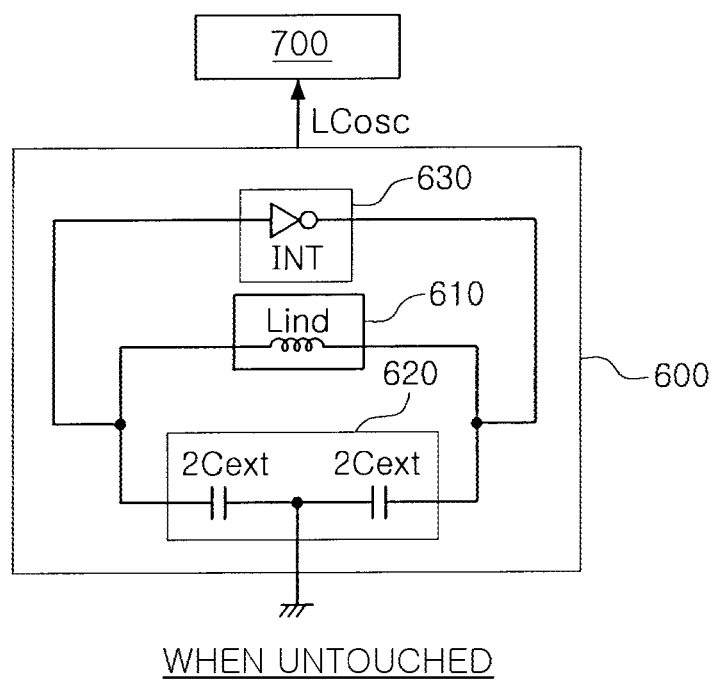
FIG. 5 is an example of a circuit diagram of an oscillation circuit when untouched.

FIG. 5 is an example of a circuit diagram of the oscillation circuit when untouched.

In FIG. 5, the oscillation circuit 600 may include an inductance circuit 610, a capacitance circuit 620, and an amplifier circuit 630, as described above. The amplifier circuit 630 may include at least one inverter INT or at least one amplifier element. Due to the amplifier circuit 630, the oscillation circuit 600 may maintain an oscillation signal.

The inductance circuit 610 may have an inductance Lind of the first coil element 611 when untouched by a non-human body input member. The capacitance circuit 620 may have a capacitance Cext (2Cext and 2Cext) of the capacitance element 621, such as an MLCC, when untouched by a human body part.

In FIG. 5, the oscillation circuit 600 may be a parallel oscillation circuit including the inductance circuit 610, having the inductance Lind of the first coil element 611, and the capacitance circuit 620 having the capacitance Cext (2Cext and 2Cext).

As an example, when untouched by a human body part or a non-human body input member, the first resonant frequency fres1 of the oscillation circuit 600 may be expressed by Equation 1 below.

$$fres1 \approx 1/2\pi sqrt(Lind*Cext) \quad (1)$$

In Equation 1, denotes sameness or similarity, and the term "similarity" means that other values may be further included.

In an example, a resistor may be connected between the first coil element 611 and the capacitance element 621. The resistor may perform an electrostatic discharge (ESD) function.

As disclosed herein, when a touch input member is in contact with a surface of the first switching member SM1 integrated or integrally formed with the housing 500 of the mobile device, a capacitive sensing method may be applied when touched by a human body part, and an inductive sensing method may be applied when touched by a non-human body input member. Thus, a distinction may be established as to whether the input member is the human body part or the non-human body input member.

Figure 6:
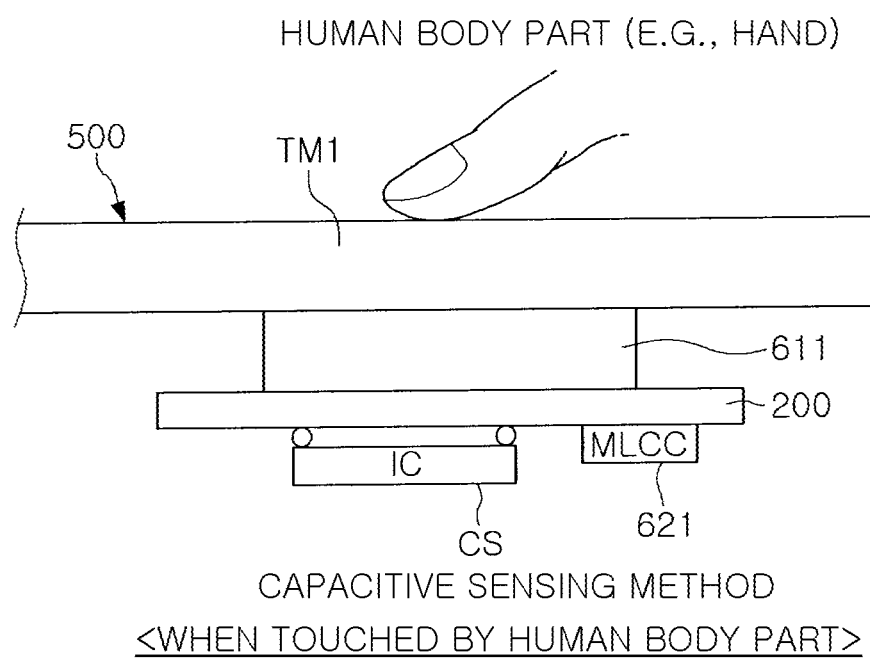
FIG. 6 illustrates an example of a capacitive sensing method when touched by a human body part.

FIG. 6 illustrates an example of a capacitive sensing method when touched by a human body part. FIG. 7 is a circuit diagram of an example of an oscillation circuit when touched by a human body part.

In FIGS. 6 and 7, when touched by a human body part, the capacitance circuit 620 of the oscillation circuit 600 may further have a touch capacitance Ctouch formed by a touch of the human body part. Thus, the overall capacitance may be varied.

For example, when a human body part (hand) touches the contact surface of the first switching member SM1, the principle of capacitive sensing is applied to increase an overall capacitance value. As a result, the resonant frequency (Equation 1) of the oscillation circuit 600 is decreased.

Figure 9:
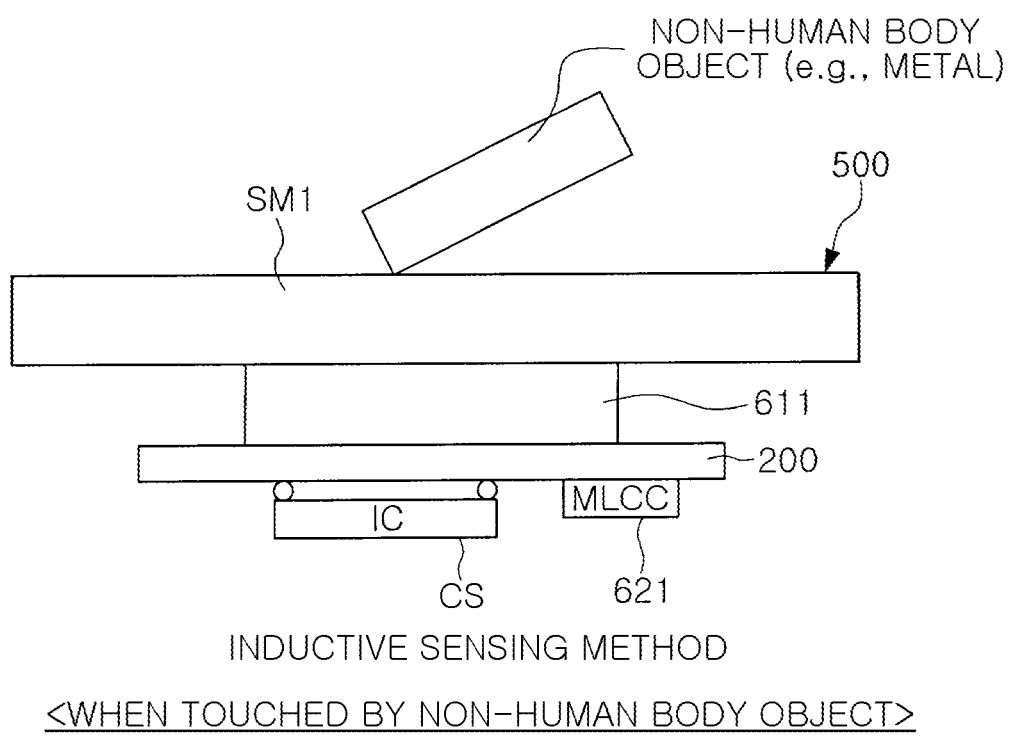
FIG. 9 illustrates an example of an inductive sensing method when touched by a non-human body input member.
Figure 10:
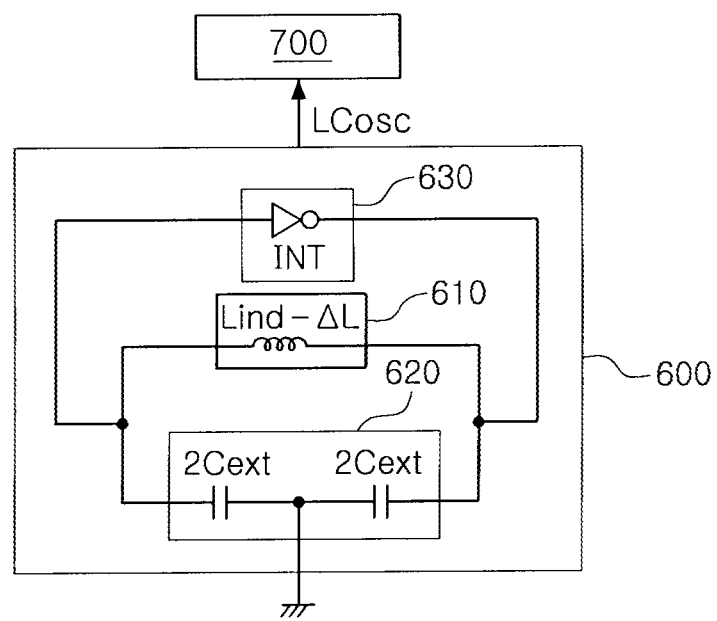
FIG. 10 is an example of a circuit diagram illustrating an example of an oscillation circuit when touched by a non-human body input member.

On the other hand, in FIGS. 9 and 10, when a non-human body input member, such as a conductor (metal), touches the contact surface of the first switching member SM1, the principle of inductive sensing is applied to decrease an inductance caused by eddy current. As a result, the resonant frequency is increased.

As described above, in the case of a touch sensing switching structure in which two sensing methods are mixed, a touch of the human body part and a touch of the non-human body input member may be distinguished from each other according to rising or falling of the resonant frequency of the oscillation signal.

FIG. 8 illustrates a detailed example of the oscillation circuit in FIG. 7.

In FIGS. 7 and 8, the oscillation circuit 600 may have a capacitance Cext (2Cext and 2Cext) from the capacitance element 621, included in the capacitance circuit 620, and a capacitance Ctouch (Ccase, Cfinger, and Cgnd) formed when touched by a human body part.

In FIG. 8, the touch capacitance Ctouch (Ccase, Cfinger, and Cgnd) may be a case capacitance Ccase and a finger capacitance Cfinger, and a ground capacitance Cgnd between circuit ground and earth, which are connected to each other in series.

Accordingly, it will be appreciated that the overall capacitance of the oscillation circuit 600 in FIG. 8 is variable, in contrast to the oscillation circuit 600 in FIG. 5.

For example, when the capacitance 2Cext and 2Cext is expressed as an equivalent circuit divided into one capacitance 2Cext and another capacitance 2Cext on the basis of circuit grounding, the case capacitance Ccase, the finger capacitance Cfinger, and the ground capacitance Cgnd may be connected to one capacitance 2Cext and another capacitance 2Cext in parallel.

As an example, when touched by a human body part, the second resonant frequency fres2 of the oscillation circuit 600 may be expressed by Equation 2 below.

$$fres2 \approx 1/\{2\pi sqrt(Lind*[2Cext \| (2Cext+CT)])\}$$

$$CT \approx Ccase \| Cfinger \| Cgnd \quad (2)$$

In Equation 2, $\approx$ denotes sameness or similarity, and the term "similarity" means that other values may be further included. In Equation 2, Ccase denotes a parasitic capacitance present between the case (cover) and the first coil element 611, Cfinger denotes a capacitance of the human body part, and Cgnd denotes a ground return capacitance between the circuit ground and the earth.

In Equation 2, "$\|$" is defined as follows: "a$\|$b" is defined as a serial connection between "a" and "b" in a circuit, and a sum value thereof is calculated as "(a*b)/(a+b)."

When comparing 1 (when untouched) and Equation 2 (when touched by the human body part), the capacitance 2Cext of Equation 1 is increased to the capacitance (2Cext+CT) of Equation 2. Therefore, it will be appreciated that the first resonant frequency fres1 when untouched is decreased to the second resonant frequency fres2 when touched.

In FIGS. 7 and 8, the oscillation circuit 600 may generate an oscillation signal, having a first resonant frequency fres1 when untouched by a human body part or a second resonant frequency fres2 when touched by a human body part, and may output the oscillation signal to the frequency digital converter 700.

FIG. 9 illustrates an example of an inductive sensing method when touched by a non-human body input member, and FIG. 10 is a circuit diagram illustrating an example of an oscillation circuit when touched by a non-human body input member.

In FIGS. 9 and 10, when a non-human body input member such as a conductor (a metal) touches a contact surface of a first switching member SM1, the principle of inductive sensing is applied, and thus, an inductance caused by eddy current may be decreased to increase a resonant frequency. As described above, a touch of the non-human body input member may be detected based on the increase in the resonant frequency.

In FIG. 10, when a touch of the non-human body input member such as metal is input to the first switching member SM1, an inductance is reduced due to a change in magnetic force between a first switching member SM1 and a first coil element 611 (Lind−ΔLind), and thus, a resonant frequency may be increased to detect the touch of the non-human body input member.

The principle inductive sensing will be described below.

When an oscillation circuit operates, AC current is generated in an inductor, and a magnetic field H-Field is generated due to the AC current. In this case, the magnetic field H-Field of the inductor affects the metal to generate a circulating current, for example, an eddy current when a metal is touched. A reverse magnetic field H-Field is generated by the eddy current. As the oscillation circuit operates in a direction in which the magnetic field H-Field of the inductor is decreased, an inductance of an existing inductor is reduced. As a result, an oscillation frequency (a sensing frequency) is increased.

In addition, a change of C (capacitance) C or L (inductance) is determined depending on whether a switching member of a housing is touched by a human body part (hand) or a conductor (a metal), which allows a decrease or an increase in frequency to be determined.

As described above, two types of sensing may be performed using a structure of a single touch sensing device, and a touch of a human body part and a touch of a non-human body input member may be detected, and may distinguished from each other and recognized, which will be described below.

Figure 11:
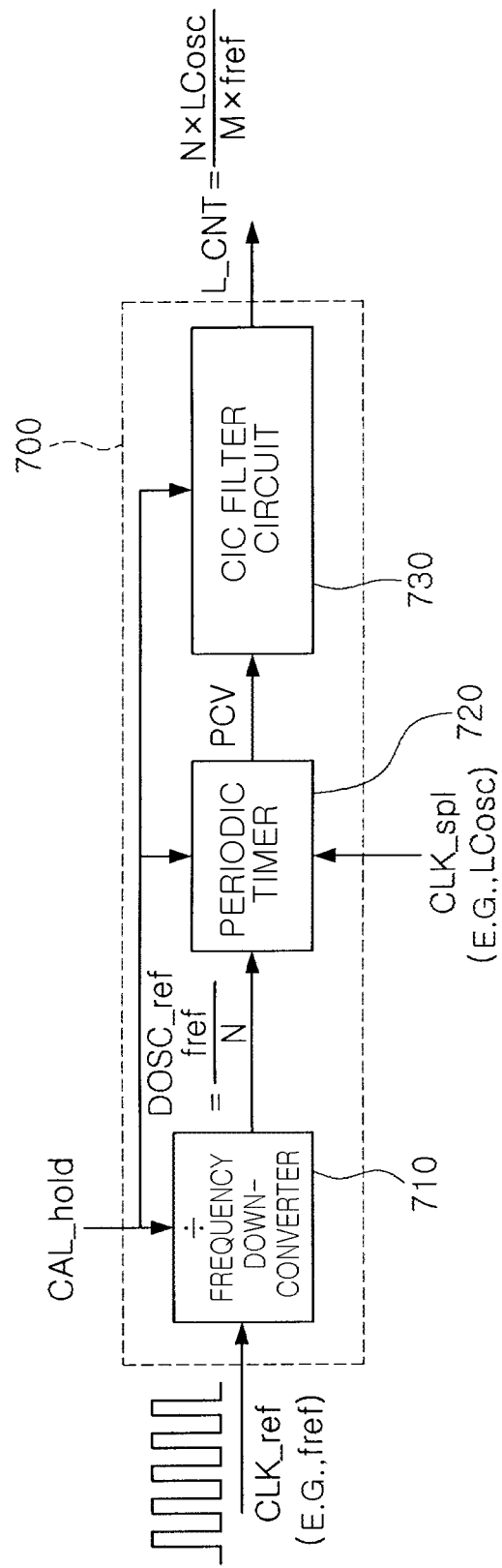
FIG. 11 is a block diagram illustrating an example of a frequency digital converter.

FIG. 11 is a block diagram illustrating an example of a frequency digital converter.

In FIG. 11, a frequency digital converter 700 converts an oscillation signal LCosc into a count value L_CNT. As an example, the frequency digital converter 700 may count a reference frequency signal (a reference clock signal) using the oscillation signal LCosc for a reference time (for example, one period). Alternatively, the frequency digital converter 700 may count the oscillation signal LCosc using a reference frequency signal (a reference clock signal) for a reference time (for example, one period).

For example, as seen in Equation 3 below, the frequency digital converter 700 may divide a reference frequency signal fref using a reference frequency division ratio N to generate a divided reference clock signal DOSC_ref=fref/N, and may divide the oscillation signal LCosc from the oscillation circuit 600 using a sensing frequency division ratio M. The frequency digital converter 700 may count the divided reference clock signal DOSC_ref using the divided oscillation signal LCosc/M to output a generated count value LC_CNT.

In contrast, the frequency digital converter 700 may count the divided reference signal using the divided sensing signal.

$$L\_CNT = (N * LCosc)/(M * fref) \quad (3)$$

In Equation 3, LCosc denotes a frequency of an oscillation signal (an oscillation frequency), fref denotes a reference frequency, N denotes a division ratio of a reference frequency (for example, 32 KHz), and M denotes a division ratio of a resonant frequency.

As seen in Equation 2, "to divide the oscillation frequency LCosc by the reference frequency fref" means that a period of the reference frequency fref is counted using the resonant frequency LCosc. When the count value L_CNT is obtained in the above manner, a low reference frequency fref may be used and a counting precision may be improved.

In FIG. 11, the frequency digital converter (CDC) 700 may include a frequency down-converter 710, a periodic timer 720, and a cascaded integrator-comb (CIC) filter circuit 730.

The frequency down-converter 710 receives a reference clock signal CLK_ref, a reference of a time period of a timer to be counted, to down-convert a frequency of the reference clock signal CLK_ref.

As an example, the reference clock signal CLK_ref, input to the frequency down-converter 710, may be any one of an oscillation signal LCosc and a reference frequency signal fref. As an example, when the reference clock signal CLK_ref is the oscillation signal LCosc input from the oscillation circuit, a frequency of the sensing frequency signal LCosc is down-converted as 'DOSC_ref=LCosc/M', where M may be set to an external entity in advance. As another example, when the reference clock signal CLK_ref is a reference frequency signal fref, the reference clock signal CLK_ref is down-converted as 'DOSC_ref=fref/N', where N may be set as an external entity in advance.

The period timer 720 may count one-period time of the divided reference clock signal DOSC_ref, received from the frequency down-converter 710, using a sample clock signal CLK_Spl to generate and output a period count value PCV.

As an example, the CIC filter circuit 730 may include a decimator CIC filter. The decimator CIC filter may perform cumulative amplification on the received period count value PCV to generate and output a count value L_CNT.

As another example, the CIC filter circuit 730 may further include a first-order CIC filter. The first-order CIC filter may calculate a moving average to remove noise from an output value of the decimator CIC filter.

As an example, the decimator CIC filter may perform cumulative amplification on the period count value from the periodic timer using a cumulative gain determined based on a period count value from the period time using a predetermined integral stage order, a predetermined decimator factor, and a predetermined comb differential delay order, and may provide the cumulatively amplified period count value.

For example, when the decimator CIC filter includes an integrating circuit, a decimator, and a differential circuit, the cumulative gain may be obtained as [(R*M)^S] based on a stage order S of the integrating circuit, a decimator factor R, and a delay order M of the differential circuit. For example, when the stage order S of the integrating circuit is 4, the decimator factor R is 1, and the delay order M of the differential circuit is 4, the cumulative gain may be 256 [(1*4)^4].

Figure 12:
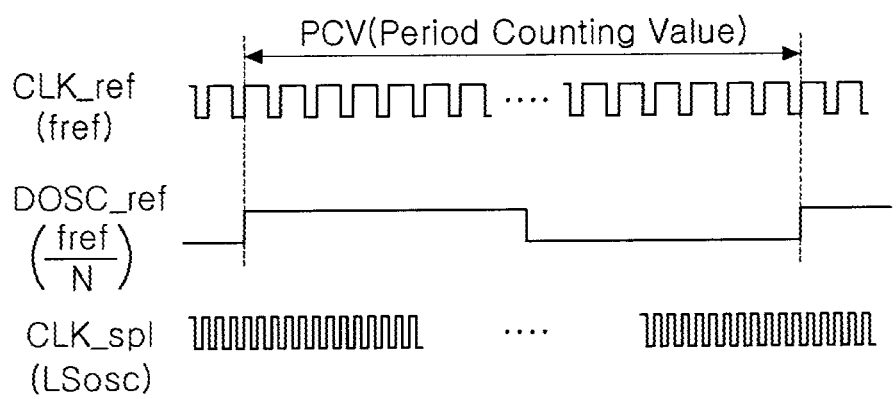
FIG. 12 illustrates an operation of an example of a periodic timer.

FIG. 12 illustrates an operation of a periodic timer.

In FIG. 12, as described above, in the periodic timer 720, the reference clock signal CLK_ref may be any one of a resonance frequency signal LCosc and a reference frequency signal fref. The reference frequency signal fref may be a signal generated by an external crystal and may be an oscillation signal such as a PLL, an RC, or the like, in an integrated circuit (IC).

As an example, when the reference clock signal CLK_ref is a resonant frequency signal LCosc received from an oscillation circuit, a sample clock signal CLK_spl may be a reference frequency signal fref. In this case, a divided oscillation signal may 'belCosc/M.'

Alternatively, when the reference clock signal CLK_ref is a reference frequency signal fref, the sample clock CLK_spl may be a resonant frequency signal LCosc. In this case, the divided oscillation signal may be 'fref/N.'

FIG. 13 is a block diagram illustrating an example of a touch detection circuit.

In FIG. 13, the touch detection circuit 800 may differentiate the count value L_CNT, received from the frequency digital converter 700, to generate a difference value Diff, and may compare the difference value Diff with each of a predetermined falling threshold value F_TH and a rising threshold value R_TH to output a touch detection signal DF having a level for identifying capacitive sensing and a touch by a hand, based on a comparison result.

As an example, the touch detection circuit 800 may subtract a delay count value L_CNT_Delay, generated by delaying the count value L_CNT by a predetermined time, and the count value L_CNT to generate a difference value Diff, and may compare the difference value Diff with the falling threshold value F_TH and the rising threshold value R_TH. The touch detection circuit 800 may output a touch detection signal Detect_Flag having a first level when the difference value Diff is less than the falling threshold value F_TH and may output a touch detection signal Detect_Flag having a second level when the difference value Diff is greater than the rising threshold value R_TH.

In FIG. 13, the touch detection circuit 800 may include a delay circuit 810, a subtraction circuit 820, and a slope detection circuit 830.

The delay circuit 810 may delay the count value L_CNT, received from the frequency digital converter 700, by a time determined based on a delay control signal Delay_Ctrl to output a delay count value L_CNT_Delay. The delay time may be determined depending on the delay control signal Delay_Ctrl.

The subtraction circuit 820 may subtract the delay count value L_CNT_Delay and the count value L_CNT to output a difference value. The count value L_CNT corresponds to a currently counted value, and the delay count value L_CNT_Delay corresponds to a value counted from current to a predetermined delay time.

The slope detection circuit 830 may compare the difference value Diff, received from the subtraction circuit 820, with a predetermined falling threshold value F_TH and a predetermined rising threshold value R_TH, and may output the touch detection signal DF having a first level or a second level determined to identify capacitive sensing and a touch by a non-human body input member, based on a comparison result.

As an example, the slope detection circuit 830 may compare the difference value Diff, the falling threshold value F_TH, and may output a touch detection signal Detect_Flag having a low level when the difference value Diff is less than the falling threshold value F_TH and may output a touch detection signal Detect_Flag having a high level when the difference value Diff is greater than the rising threshold R_TH.

As an example, an upper limit value FU_Hys and a lower limit value FL_Hys of falling hysteresis may be set and used based on the falling threshold value F_TH. An upper limit value RU_Hys and a lower limit value RL_Hys of rising hysteresis may be set and used based on the rising threshold value R_TH.

As described above, an error caused by temperature drift may be prevented using a difference value Diff for slope, and a touch detection precision may be improved using the upper and lower limits FU_Hys and FL_Hys of the falling hysteresis and the upper and lower limits RU_Hys and RL_Hys of the rising hysteresis. In FIG. 13, RH_Time represents a predetermined time for determining falling maintenance and rising maintenance.

Figure 14:
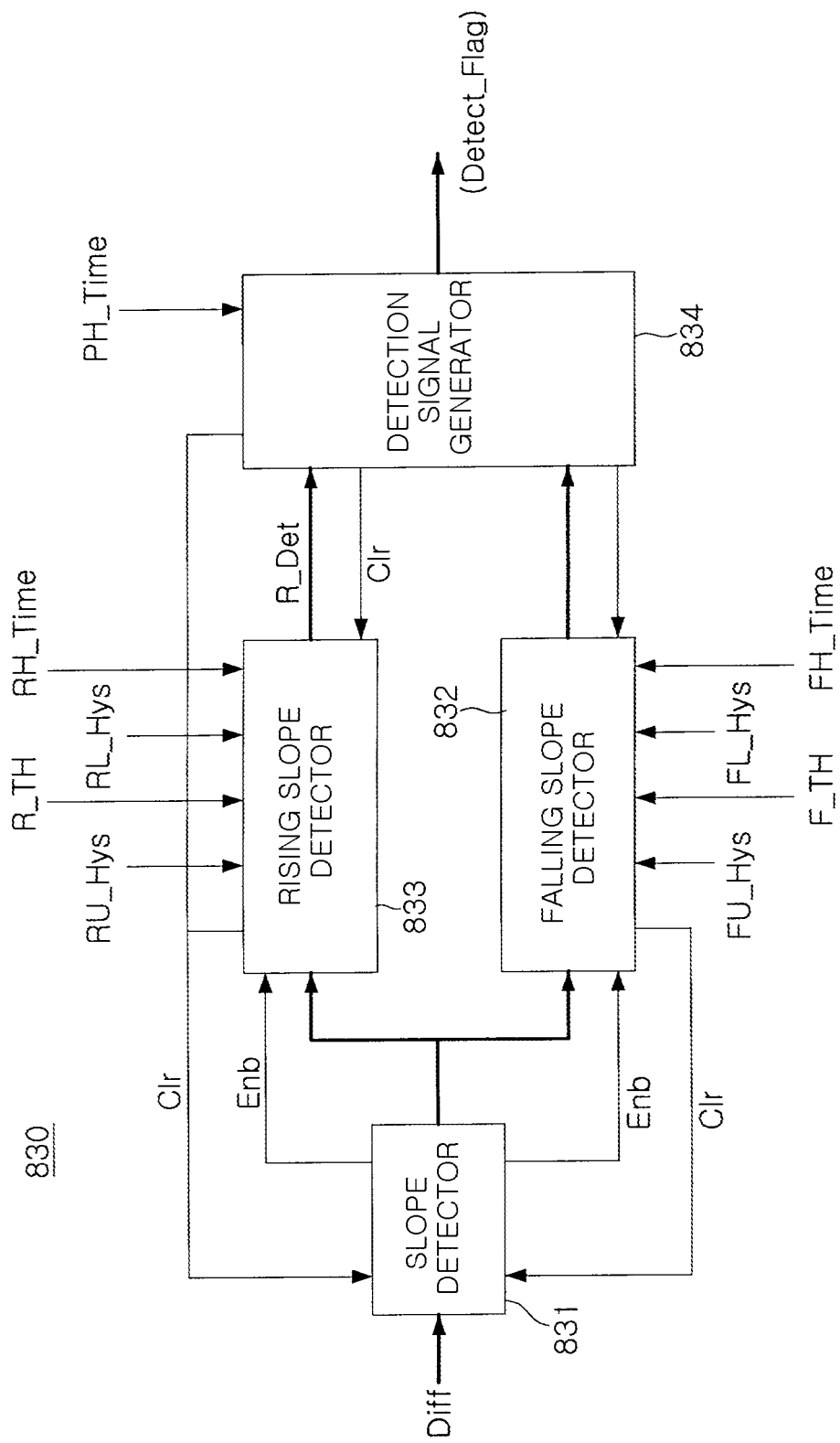
FIG. 14 is a block diagram illustrating an example of a slope detection circuit in FIG. 13.

FIG. 14 is a block diagram illustrating an example of a slope detection circuit in FIG. 13.

In FIG. 14, a detection signal generator 834 may generate a touch detection signal Detect_Flag having a first level, in a touch by a human body part, when the difference value Diff increases after falling and may generate a touch detection signal Detect_Flag having a second level, in a touch by a non-human body input member, when the different value Diff decreases after rising, based on a falling detection signal F_Det and a rising detection signal R_Det.

For example, in FIG. 14, the slope detection circuit 830 may include a slope detector 831, a falling slope detector 832, a rising slope detector 833, and a detection signal generator 834.

The slope detector 831 determines whether a received difference value Diff of slope increases or decreases. For example, the slope detector 831 may determine whether the difference value Diff decreases or increases, and may output an enable signal Enb=1 in an active state when the difference value Diff increases and may output an enable signal Enb=0 in an inactive state when the difference value Diff decreases.

As an example, when the received difference value decreases, the slope detector 831 may output an enable signal Enb=1 in an active state to start operation to the falling slope detector 832 and the rising slope detector 833. Meanwhile, when the received difference values increase, the slope detector 831 may output an enable signal Enb=0 to perform no operation to the falling slope detector 832 and the rising slope detector 833.

The falling slope detector 832 generates a falling detection signal F_Det when the enable signal enters the active state Enb=1 and the received difference value Diff is less than or equal to a falling threshold value F_TH for a predetermined time FH_Time.

The rising slope detector 833 generates a rising detection signal R_Det when the enable signal enters the active state Enb=1, and the received difference value Diff is greater than or equal to a rising threshold value R_TH for a predetermined time RH_Time. As an example, the rising slope detector 833 may generate a rising detection signal R_Det when the enable signal enters the active state Enb=1 and the difference value Diff is greater than or equal to values of rising periods R_TH, RU_Hys, and RL_Hys for the predetermined time RH_Time.

The detection signal generator 834 may generate a touch detection signal Detect_Flag having a first level or a second level based on the received falling detection signal F_Det and the received rising detection signal R_Det.

In addition, a process of generating the touch detection signal Detect_Flag is based on whether the falling detection signal F_Det and the rising detection signal R_Det are simultaneously activated and an active time interval PH_Time of the signals F_Det and R_Det.

When a generation of a final touch detection signal Detect_Flag is completed, the detection signal generator 834 may generate and transmit an initialization signal clr to the slope detector 831, the falling slope detector 832, and the rising slope detector 833.

Figure 15:
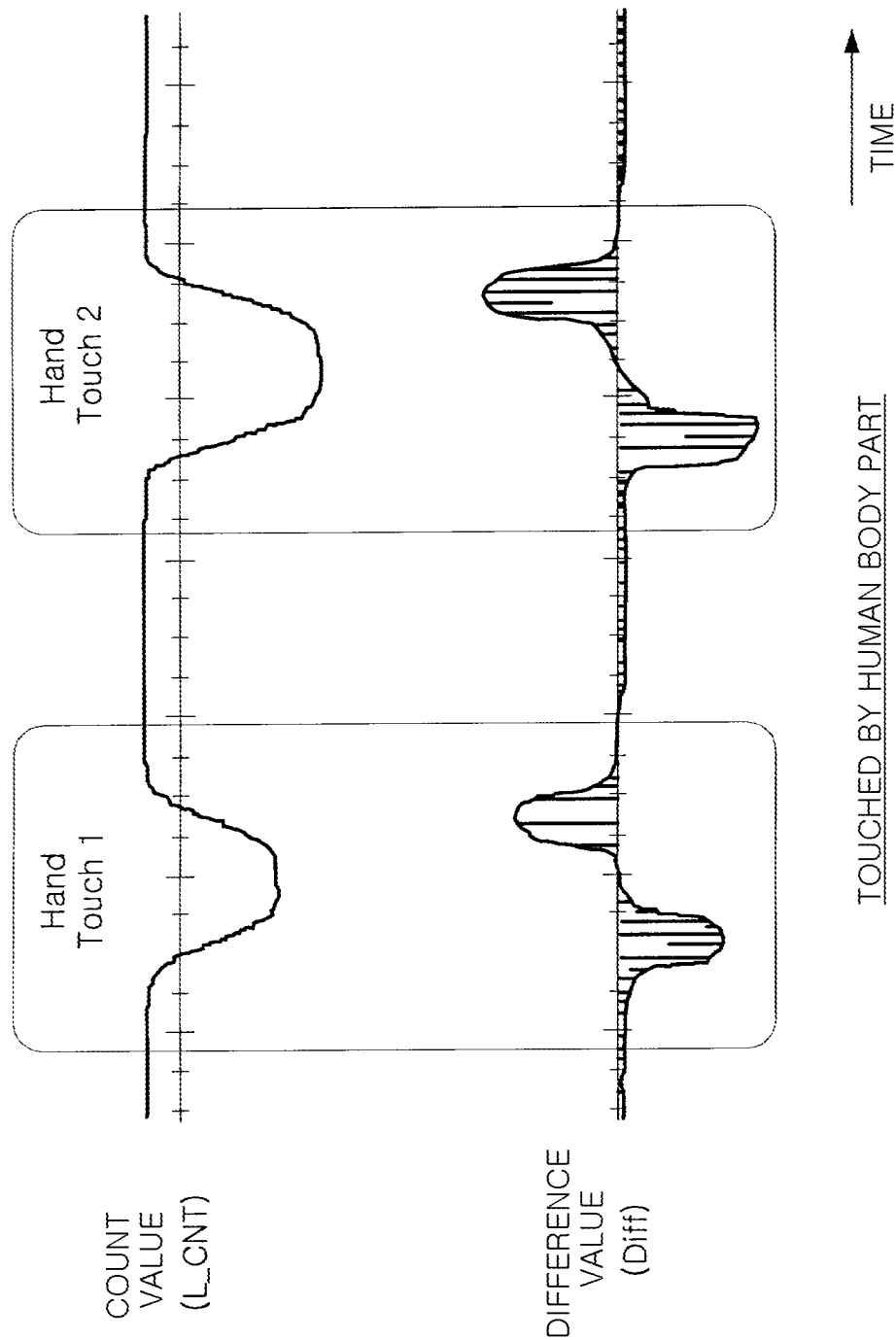
FIG. 15 illustrates an example of a count value and a difference value (a slope value of a count value) when touched by a human body part.
Figure 16:
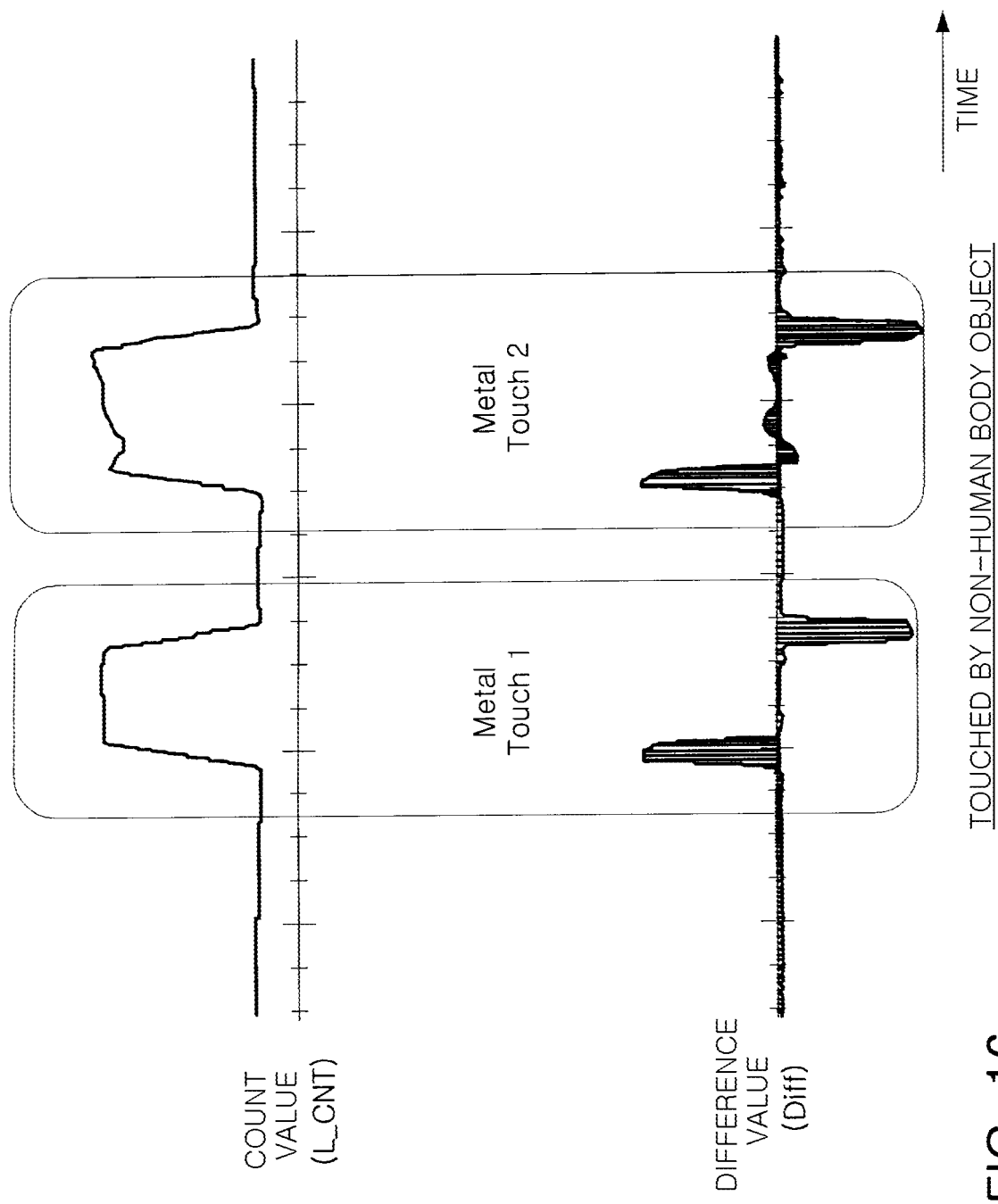
FIG. 16 illustrates an example of a count value and a difference value when touched by a non-human body input member.

FIG. 15 illustrates an example of a count value and a difference value (a slope value of a count value) when touched by a human body part, and FIG. 16 illustrates an example of a count value and a difference value when touched by a non-human body input member.

In FIG. 15, waveforms are examples of waveforms for a count value, measured when a hand touches a first coil element installed below a first switching member, and a difference value (a slope change). In FIG. 16, waveforms are examples of waveforms for a count value, measured when a conductor such a metal touches a first coil element installed below a first switching member, and a difference value, a slope change.

In FIG. 15, it can be seen that a first switching member on a first coil member operates in a capacitive manner to decrease a count value L_CNT when a human body part (hand) touches the first switching member and to increase the count value L_CNT to an original state thereof when the human body part (hand) does not touch the first switching member. If a slope value is checked based on the above phenomenon, it can be seen that the slope value decreases when touched by the human body part (hand) and increases when untouched by the human body part (hand).

As described above, when touched by the human body part (hand), a slope change, a difference value, appears to be a pair of rising slopes after a falling slope.

Meanwhile, in FIG. 16, it can be seen that a first switching member on a first coil element operates in an inductive manner to increase a count value L_CNT when a conductor (metal) touches the first switching member and to decrease the count value L_CNT to an original state thereof when the conductor (metal) does not touch the first switching member.

As described above, when touched by the conductor (metal), a slope change, a difference value, appears to be a pair of falling slopes after a rising slope.

For example, it can be seen that when the human body part (hand) or the conductor (metal) touches the first switching member on the first coil element, a slope change a pair of falling slope, corresponding to the human body part, and rising slope, corresponding to the conductor, and the order in which the falling slope and the rising slope appear, varies depending on the touch input member.

Figure 17:
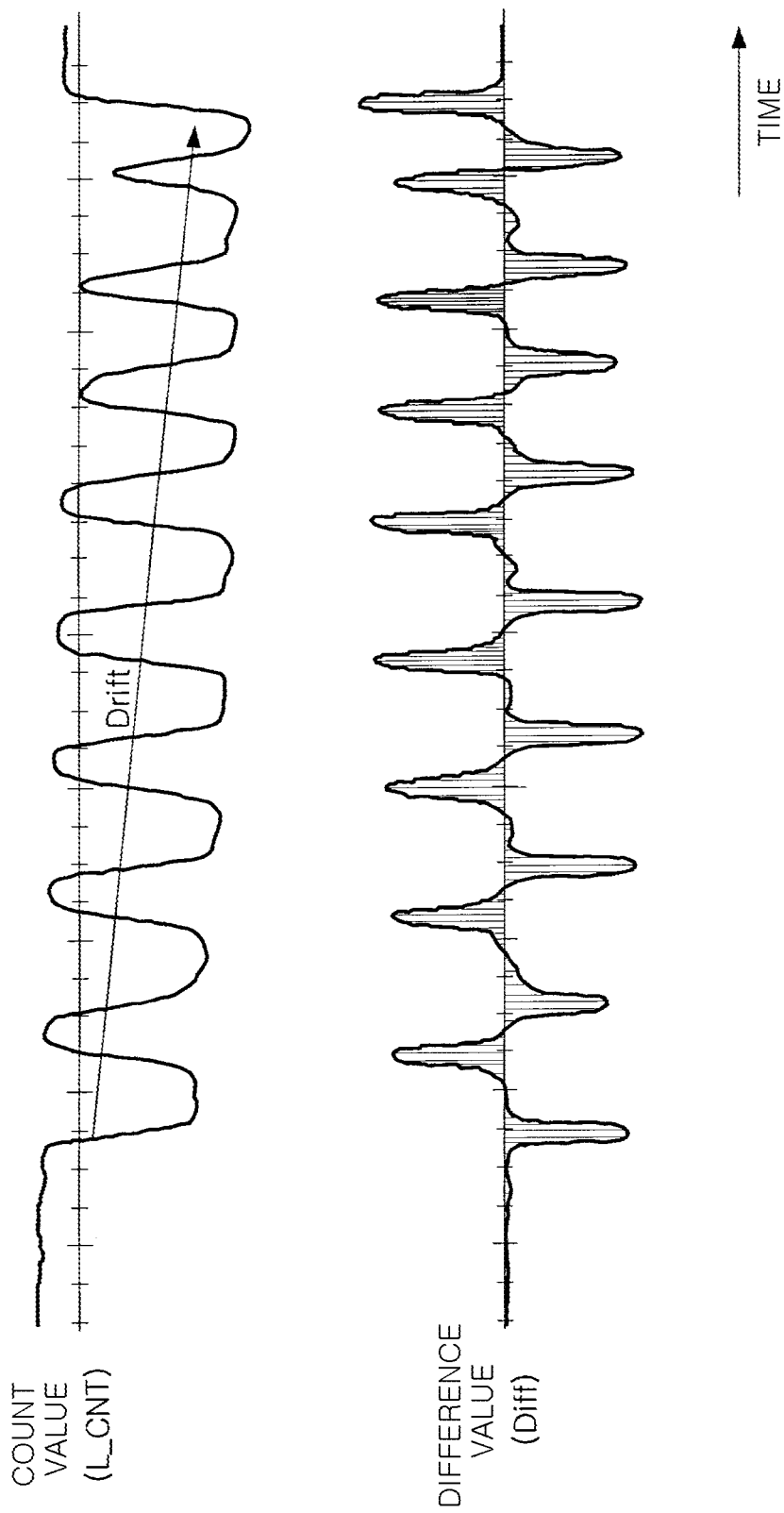
FIG. 17 illustrates an example of drift of a count value and a difference value when touched by a human body part.

FIG. 17 illustrates an example of drift of a count value and a difference value when touched by a human body part.

In FIG. 17, in addition, when the first coil element is and continuously touched by a human body part (hand), a falling drift of a counter value occurs due to a change in temperature of a first coil element. For this reason, an influence caused by the temperature drift may be excluded using a slope change, rather than an absolute counter level, to determine whether the first coil element is touched.

Accordingly, the touch by the human body part (hand) may confirm that a slope in an initial state increases above a rising threshold value after falling below a falling threshold value.

In addition, when the touch by the human body part and the touch by the conductor are mixed, both of the touches process a falling slope and a rising slope as a pair, the touch by the human body part processes the rising slope after the falling slope as a pair, and the touch by the conductor processes the falling slope after the rising slope as a pair. Therefore, an operation for the touch by the conductor (the falling slope after the rising slope) may be detected and eliminated.

In addition, when a fall below the falling threshold value is detected again without a rise after the fall below the falling threshold in the initial state, a malfunction may be prevented through an initialization process.

Figure 18:
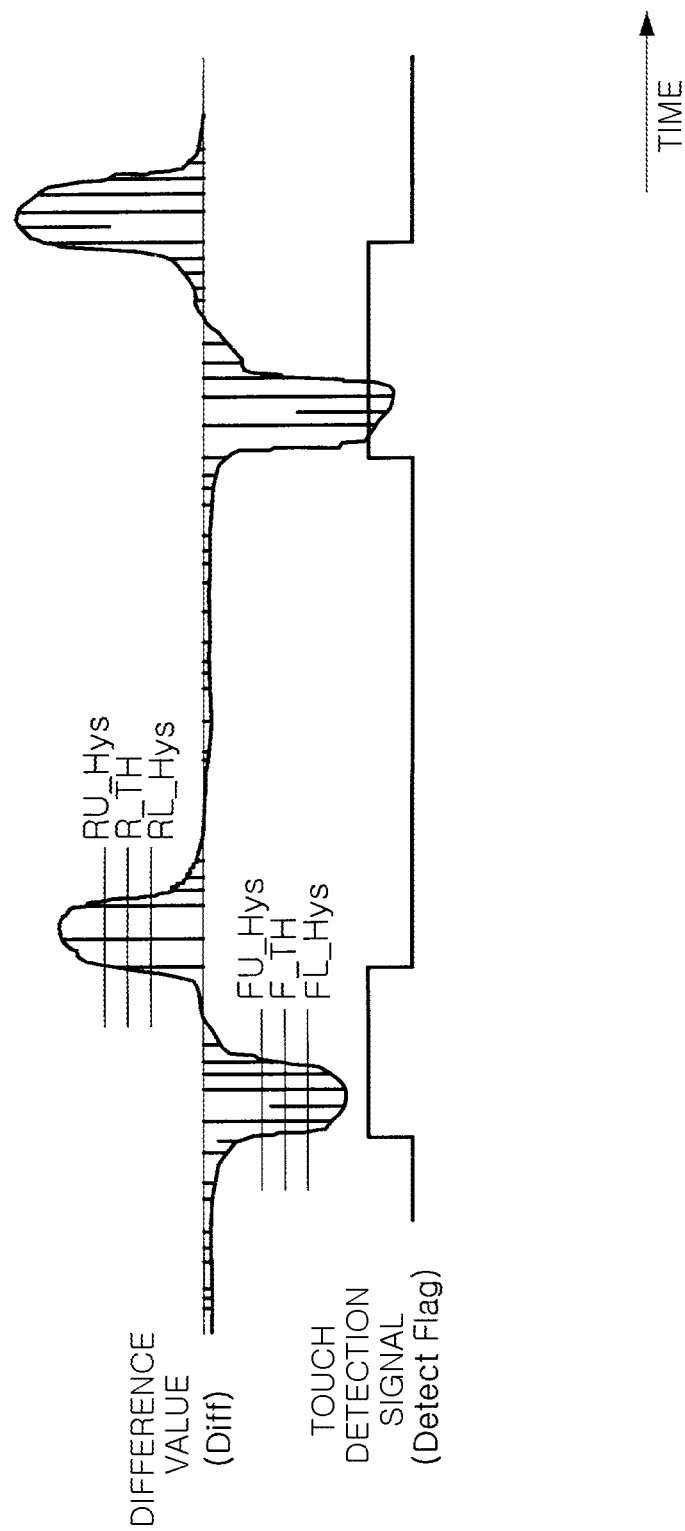
FIG. 18 illustrates an example of a difference value change, a falling threshold value, a rising threshold value, and a touch detection signal.

FIG. 18 illustrates an example of a difference value change, a falling threshold value, a rising threshold value, and a touch detection signal.

In detail, FIG. 18 illustrates examples of a falling threshold value F_TH and a rising threshold value R_TH, falling hysteresis intervals FU_Hys and FL_Hys for the respective threshold values, and rising hysteresis intervals RU_Hys and RL_Hys for the respective threshold values, and illustrates an example of a final touch detection signal Detect_Flag for the respective threshold values.

The above-mentioned respective threshold values and respective hysteresis intervals may be stored in a memory or a register by a user to be varied and reset depending on a state of a set or a module.

Figure 19:
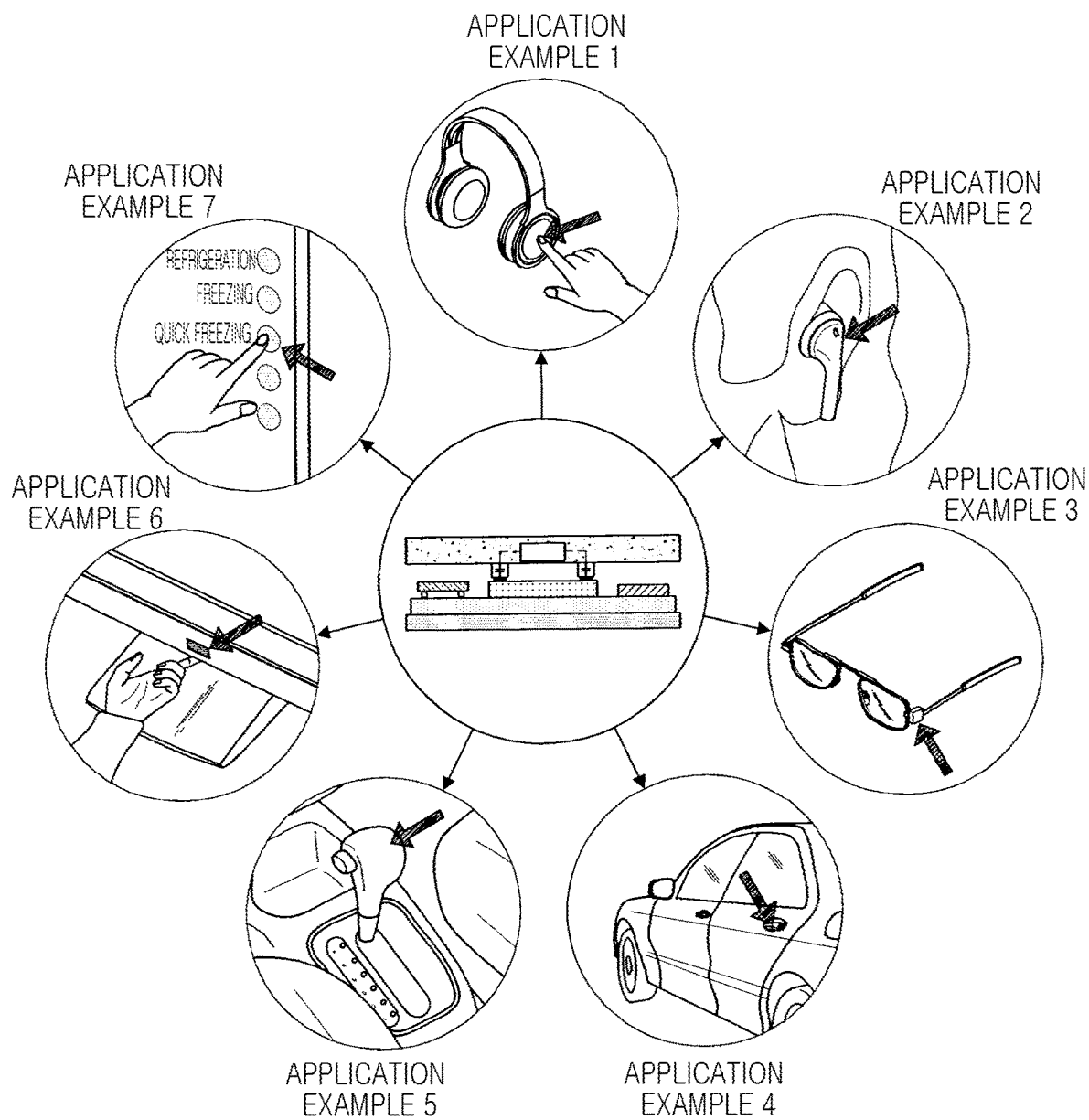
FIG. 19 illustrates examples of various applications of a switching operation detection apparatus of this application.

FIG. 19 illustrates examples of various applications of a switching operation detection apparatus of this application.

A plurality of first to seventh application examples of a switching operation sensing apparatus according to this application is illustrated in FIG. 19.

In FIG. 19, the first application example may be an example which may be applied to replace operation control buttons of a Bluetooth headset, and the second application example may be an example which may be applied to replace operation control buttons of a Bluetooth earset. As an example, the second application example may be applied to replace a power on/off switch of the Bluetooth headset and the Bluetooth earphone.

In FIG. 19, the third application example may be an example that may be applied to replace operation control buttons of smart glasses. As an example, the third application example may be applied to replace a button for performing functions of a phone, mail, home button, and the like, of a device such as Google Glass, a VR headset, an AR headset, or the like.

In FIG. 19, the fourth application example may be an example that may be applied to replace a door lock button of a vehicle. The fifth application example may be an example that may be applied to replace a smart key button of a vehicle. The sixth application Example may be an example that may be applied to replace an operation control button of a computer. The seventh application example may be an example that may be applied to replace an operation control button of a refrigerator.

Besides, the switching operation detection apparatus of this application may be used to replace volume and power switches of a laptop computer and switches of a VR, a head-mounted display (HMD), a Bluetooth earphone, a stylus touch pen, and the like. In addition, the switching operation detection apparatus may be used to replace buttons of a monitor of home appliances, a refrigerator, a laptop computer, and the like.

For example, the operation control button may be integrated with a cover, a frame, or a housing of an apparatus to which the operation control bottom is applied, and may be used to turn on/off power, adjust a volume, and perform other specific functions (for example, back, movement to home, lock, and the like).

In addition, the switching operation detection apparatus of this application may include a plurality of touch switches to perform a plurality of functions when performing the corresponding functions (for example, back, movement to home movement, lock, and the like).

The touch switch of this application is not limited to the above-mentioned buttons of devices and may be applied to devices such as mobile and wearable devices, each having a switch. In addition, the touch switch of this application may be applied to implement an integrated design.

When the above-described embodiments of this application are applied to a mobile device, a thinner, simpler, and tidier design may be implemented and, unlike a capacitive sensing method, a converter (ADC) is not required, and an application structure may be easily implemented by directly attaching the touch switch to a target surface of a switching member. Furthermore, a dustproof and waterproof switch may be implemented, and sensing may be performed even in a humid environment, unlike capacitive sensing.

As described above, in a touch switching structure using a housing as a case of an electric device, a touch input member for an input operation may be identified based on a slope change including a capacitive change and an inductive change depending on the input member of the input operation, such as a human body part or a non-human body input member. Accordingly, sensing precision of a touch input may be improved, and a malfunction, which may result from a touch error caused by a non-human body input member rather than a human body part, may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switching operation sensing apparatus configured to be added to an electronic device, the electronic device comprising:
   an input operation unit, the input operation unit comprising a first switching member disposed in a housing;
   an oscillation circuit configured to generate an oscillation signal having a resonant frequency, varying based on a capacitive change or an inductive change, depending on a touch input member in contact with the first switching member during an input operation;
   a frequency digital converter configured to convert the oscillation signal into count values; and
   a touch detection circuit configured to detect capacitive sensing and inductive sensing based on a slope change of the count values received from the frequency digital converter, and output corresponding touch detection signals based on the detection.

2. The switching operation sensing apparatus of claim 1, wherein the corresponding touch detection signals have different levels with each other.

3. The switching operation sensing apparatus of claim 1, wherein the frequency digital converter is further configured to generate the count values by counting a reference clock signal using the oscillation signal.

4. The switching operation sensing apparatus of claim 3, wherein the first switching member and the housing are formed of a same material.

5. The switching operation sensing apparatus of claim 4, wherein the input operation unit further comprises a second switching member integrated with the housing and disposed in a location different from a location of the first switching member, and
   the second switching member and the housing are formed of the same material.

6. The switching operation sensing apparatus of claim 1, wherein the oscillation circuit comprises:
   an inductance circuit comprising a first coil element disposed on an inner side of the first switching member; and
   a capacitance circuit comprising a capacitance element connected to the inductance circuit,
   wherein the oscillation signal has a first frequency characteristic when the first switching member is touched by a human body part and a second frequency characteristic when the first switching member is touched by a non-human body input member.

7. The switching operation sensing apparatus of claim 1, wherein the oscillation circuit comprises:
   an inductance circuit, comprising a first coil element disposed on an inner side of the first switching member, having a varying inductance when the first switching member is touched by a non-human body input member; and
   a capacitance circuit, comprising a capacitance element connected to the inductance circuit, having a varying capacitance when the first switching member is touched by a human body part.

8. The switching operation sensing apparatus of claim 6, wherein the first coil element, mounted on a substrate, is attached to an inner side surface of the first switching member.

9. The switching operation sensing apparatus of claim 1, wherein the frequency digital converter is further configured to generate a divided reference clock signal by dividing a reference frequency signal using a reference frequency division ratio, and output the count values generated by counting the divided reference clock signal using the oscillation signal.

10. The switching operation sensing apparatus of claim 1, wherein the frequency digital converter is further configured to generate a reference clock signal divided by dividing a reference frequency signal using a reference frequency division ratio, divide an oscillation signal from the oscillation circuit using a sensing frequency division ratio, and output the count values generated by counting the divided reference clock signal using the divided oscillation signal.

11. The switching operation sensing apparatus of claim 2, wherein the frequency digital converter comprises:
   a frequency down-converter configured to receive a reference frequency signal as a reference clock signal, and generate a divided reference clock by dividing the reference clock signal using a reference frequency division ratio to down-convert a frequency of the reference frequency signal;

a periodic timer configured to receive the oscillation signal as a sample clock signal, and output a frequency count value generated by counting one-period time of the divided reference clock signal, received from the frequency down-converter, using the sample clock signal; and a cascaded integrator-comb (CIC) filter circuit configured to output the count values generated by performing cumulative amplification on period count values received from the periodic timer.

12. The switching operation sensing apparatus of claim 11, wherein the CIC filter circuit comprises a decimator CIC filter configured to output the count values generated by performing cumulative amplification on the period count values received from the periodic timer, perform cumulative amplification on the period count values from the period timer using a predetermined integral stage order, a predetermined decimator factor, and a predetermined comb differential delay order, and provide cumulatively amplified period count value.

13. The switching operation sensing apparatus of claim 12, wherein the touch detection circuit differentiates the count values, received from the frequency digital converter, to generate a difference value and compares the difference value with each of a predetermined falling threshold value and a predetermined rising threshold value to output the touch detection signal having one of the different levels for identifying capacitive sensing and inductive sensing based on a comparison result.

14. The switching operation sensing apparatus of claim 12, wherein the touch detection circuit comprises:

a delay circuit configured to delay the count values, received from the frequency digital converter, by a time determined based on a delay control signal to output delay count values;

a subtraction circuit configured to subtract one of the count values from one of the delay count values to generate and output a difference value; and a slope detection circuit configured to compare the difference value, received from the subtraction circuit, with each of a predetermined falling threshold value and a predetermined rising threshold value to output the touch detection signal having a first level or a second level for identifying capacitive sensing and inductive sensing based on a comparison result.

15. The switching operation sensing apparatus of claim 13, wherein the slope detection circuit comprises:

a slope detector configured to determine whether the difference value decreases or increases, and output an enable signal in an active state when the difference value decreases and an enable signal in an inactive state when the difference value increases;

a falling slope detector configured to generate a falling detection signal when the enable signal enters the active state and the difference value is less than or equal to a falling threshold value for a predetermined time;

a rising slope detector configured to generate a rising detection signal when the enable signal enters the active state and the difference value is greater than or equal to a rising threshold value for the predetermined time; and a detection signal generator configured to generate the touch detection signal having a first level or a second level based on the falling detection signal and the rising detection signal.

16. The switching sensing apparatus of claim 15, wherein the detection signal generator generates a touch detection signal, having a first level in response to a touch by a human body part, based on the falling detection signal and the rising detection signal, when the difference value increases after falling.

17. The switching operation sensing apparatus of claim 15, wherein the detection signal generator generates a touch detection signal, having a second level in response to inductive sensing, based on the falling detecting signal and the rising detection signal, when the difference value decreases after rising.

18. The switching operation sensing apparatus of claim 1, wherein the apparatus is any of Bluetooth headset, Bluetooth earphone, smart glasses, a VR headset, an AR headset, smart key button of a vehicle, laptop, computer, a head-mounted display (HMD), and a stylus touch pen.

19. An apparatus comprising:

a housing;

an input operation unit comprising a first switching member integrally formed with the housing;

an oscillation circuit configured to generate an oscillation signal based on a contact of touch input members on the first switching member; and a touch detection circuit configured to determine one of a capacitive sensing and an inductive sensing based on a change of slope of count values of the oscillation signal, and output a detection signal based on the determined sensing.

20. The apparatus of claim 19, wherein the oscillation circuit is further configured to generate the oscillation signal having resonant frequencies corresponding to the touch input members in contact with the first switching member during an input operation.

21. The apparatus of 19, wherein a frequency digital converter, connected to the oscillator circuit, is configured to convert the oscillation signal into the count values.

22. The apparatus of claim 19, wherein the input operation unit further comprises a second switching member integrally formed with the housing and disposed in a location different from a location of the first switching member.

23. The apparatus of claim 19, wherein the contact of the touch input members is determined to be the capacitive sensing when the contact is a human body touch, and the inductive sensing when the contact is a non-human input member.

* * * * *